(12) United States Patent
Takeda

(10) Patent No.: US 7,292,481 B2
(45) Date of Patent: Nov. 6, 2007

(54) SEMICONDUCTOR STORAGE DEVICE

(75) Inventor: Koichi Takeda, Tokyo (JP)

(73) Assignee: NEC Corporation, Tokyo (JP)

( * ) Notice: Subject to any disclaimer, the term of this patent is extended or adjusted under 35 U.S.C. 154(b) by 65 days.

(21) Appl. No.: 10/570,313

(22) PCT Filed: Aug. 27, 2004

(86) PCT No.: PCT/JP2004/012368

§ 371 (c)(1),
(2), (4) Date: Mar. 2, 2006

(87) PCT Pub. No.: WO2005/024838

PCT Pub. Date: Mar. 17, 2005

(65) Prior Publication Data

US 2006/0268627 A1    Nov. 30, 2006

(30) Foreign Application Priority Data

Sep. 4, 2003   (JP) ............................... 2003-313056

(51) Int. Cl.
*G11C 7/10* (2006.01)
(52) U.S. Cl. ........................... 365/189.05; 365/189.08; 365/203; 365/205
(58) Field of Classification Search ........... 365/189.05, 365/189.01, 189.08, 203, 205, 230.08
See application file for complete search history.

(56) References Cited

U.S. PATENT DOCUMENTS 5,864,696 A    1/1999 McClure
6,067,256 A *  5/2000 Yamashita et al. ...... 365/189.04
6,351,423 B2 * 2/2002 Ooishi ........................ 365/207
6,434,661 B1 * 8/2002 Konishi et al. .............. 711/105

OTHER PUBLICATIONS

R. V. Joshi, et al. "A 2 GHz Cycle, 430 ps Access Time 34Kb L1 Directory SRAM in 1.5 V, 0.18 μm CMOS Bulk Technology," 2000 Symposium on VLSI Circuits Digest of Technical Papers, 2000.

* cited by examiner

*Primary Examiner*—Anh Phung
*Assistant Examiner*—Toan Le
(74) *Attorney, Agent, or Firm*—Sughrue Mion Pllc.

(57) ABSTRACT

There is provided a semiconductor storage device capable of executing a high-speed read operation without increasing a chip area thereof. The semiconductor storage device includes per-bit sensing circuits 103 each connected to a pair of bit lines (BLT, BLN) and a data output circuit 104 connected to the bit lines BLT from the per-bit sensing circuits, for outputting read data. Each of the per-bit sensing circuits 103 includes a pre-charge circuit for setting the bit line pair to a supply voltage VDD when a bit line pair selection signal YS is inactive, a latch circuit for setting the bit line pair to complementary levels (VDD and GND) according to a read signal when the bit line pair selection signal YS and a sensing circuit activation signal SE are active, and a data write circuit connected to a pair of write data lines (WDT, WDN), for setting one of the bit line pair to a second level (GND) according to write data when the bit line pair selection signal is active. The data output circuit 104 includes a logic circuit and an output transistor. The logic circuit outputs a first value when the bit lines are all at a first level (VDD) and outputs a second value when at least one of the bit lines is at the second level. The output transistor outputs read data to a data output line DL based on an output of the logic circuit.

23 Claims, 14 Drawing Sheets

SEMICONDUCTOR STORAGE DEVICE

This application claims priority from PCT Application No. PCT/JP2004/012368 filed Aug. 27, 2004 and from Japanese Application No. 2003-3 13056 filed Sep. 4, 2003, which applications are incorporated herein by reference.

TECHNICAL FIELD

The present invention relates to a semiconductor storage device. More specifically, the invention relates to a configuration of a sensing circuit suitable for being applied to a static random access memory for which an ultra-high speed operation is required, and the semiconductor storage device including the sensing circuit.

BACKGROUND ART

In custom ICs such as an ASIC (Application Specific Integrated Circuit) or the like, improvement in an operating speed is realized by transistor finer geometries. A gate delay time t is formulated as shown in the following expression (1), using a capacitance C, a voltage V, and a current I. That is, the gate delay time is proportional to a value obtained by dividing electric charge accumulated in the capacitance (=the capacitance C×the voltage V) by the current I.

$$t \propto C \cdot V/I \quad (1)$$

When finer device geometries are achieved (e.g. when a channel length or a gate oxidization film thickness is reduced), each parameter of the capacitance, voltage, or current is reduced to 1/K according to a scaling rule (a proportional reduction rule). Thus, likewise, the gate delay time t can also be reduced to 1/K.

On the other hand, SRAMs (static random access memories) cannot reduce the delay time to 1/K just by achieving the finer device geometries. The following is a description about this.

A bit line delay time $t_{b1}$, which constitutes a lot in the delay time of the SRAM can be formulated as in the following expression (2) using a bit line capacitance $C_{b1}$, a potential difference between a bit line pair $\Delta V_{b1}$, and a cell current $I_{cell}$.

$$t_{b1} = C_{b1} \cdot \Delta V_{b1}/I_{cell} \quad (2)$$

With achievement of the finer geometries, the capacitance $C_{b1}$ and the cell current $I_{cell}$ can be reduced to 1/K according to the scaling rule (proportional reduction rule). On contrast therewith, the potential difference between a bit line pair $\Delta V_{b1}$ is a parameter determined by an offset voltage of a sense amplifier, and cannot be reduced with achievement of the finer geometries. Accordingly, the bit line delay time $t_{b1}$ cannot be reduced to 1/K with achievement of the finer geometries.

As described above, a higher-speed operation of the SRAM cannot be performed just by achieving the transistor finer geometries. For this reason, in the conventional SRAM, by changing a memory configuration, the higher speed is achieved (refer to Non-patent Document 1, for example). When the number of cells per bit line is reduced to a half, the bit line capacitance $C_{b1}$ is also almost halved. As a result, according to the above expression (2), the bit line delay time $t_{b1}$ is also likewise almost halved.

However, this design method increases the number of banks and the number of sensing circuits.

FIG. 8 is a diagram showing a typical configuration example of a conventional sensing circuit. Referring to FIG. 8, a memory cell array 801 includes memory cells arranged at intersections between a plurality of word lines not shown and a plurality of bit line pairs. A memory cell includes a flip-flop and two pass transistors (also referred to as "access transistors"). The flip-flop is constituted by cross-connecting inputs and outputs of two inverters. The two pass transistors are connected between a connecting node of the inputs and the outputs of the two inverters and respective bit lines of a bit line pair. Gates of the two pass transistors are connected in common to a word line.

Referring to FIG. 8, a bit line pair selection circuit 802 includes a pMOS transistor P101 with a source thereof connected to a power supply VDD and a drain thereof connected to a bit line BLT, a PMOS transistor P102 connected between a pair of the bit line BLT and a bit line BLN, and a PMOS transistor P103 with a source thereof connected to the power supply VDD and a drain thereof connected to the bit line BLN. Gates of the pMOS transistors P101, P102, and P103 are connected in common to a pre-charge control signal PC.

The bit line pair selection circuit 802 further includes an nMOS transistor N101, an nMOS transistor N102, an NOR circuit 811, a pMOS transistor P104, and a pMOS transistor P105. The nMOS transistor N101 is connected between the bit line BLT and a write data signal line WDT, which is one of a pair of the write data signal line WDT and a write data signal line WDN. The nMOS transistor N102 is connected between the other write data signal line WDN of the write data signal line pair and the bit line BLN. Two input terminals of the NOR circuit 811 are connected to a write control signal (write enable signal)/WE and a bit line pair selection signal /YS (also referred to as a "column selection signal"), and an output terminal of the NOR circuit 811 is connected in common to gates of the nMOS transistors N101 and N102. The pMOS transistor P104 is connected between a node SAT of a sense amplifier 803 and the bit line BLT. The pMOS transistor P105 is connected between a node SAN of the sense amplifier 803 and the bit line BLN. Gates of the pMOS transistors P104 and P105 are connected in common to the bit line pair selection signal /YS. The write control signal /WE and the bit line pair selection signal /YS become active at low levels thereof (of a ground potential GND). The bit line pair selection signal /YS is output from a column decoder not shown (for decoding a column address and selecting a bit line pair corresponding to the address).

Referring to FIG. 8, the sense amplifier 803 includes a pMOS transistor P204 with a source thereof connected to the power supply VDD and a drain thereof connected to the node SAT, a pMOS transistor P205 with a source thereof connected to the power supply VDD and a drain thereof connected to the node SAN, and a pMOS transistor P203 connected between the nodes SAT and SAN. Gates of the pMOS transistors P203, P204, and P205 are connected in common to a control signal RSE. Before or after read and write operations, the control signal RSE is driven low, and the nodes SAT and SAN are both set to the power supply voltage VDD. The sense amplifier 803 includes a pMOS transistor P201 with a source thereof connected to the power supply VDD and a drain thereof connected to the node SAT, a pMOS transistor P202 with a source thereof connected to the power supply VDD and a drain thereof connected to the node SAN, and nMOS transistors N201 and N202 with drains thereof connected to the node SAT and the node SAN, respectively, and sources thereof connected in common. Gates of the pMOS transistor P201 and the nMOS transistor N201 are connected in common to the node SAN. The gates of the pMOS transistor P201 and the nMOS transistor N201 are connected in common to the node SAN.

The sense amplifier 803 further includes an nMOS transistor N203 with a drain thereof connected to a common connecting node between the sources of the nMOS transistors N201 and N202 and an nMOS transistor N204 with a drain thereof connected to a source of the nMOS transistor N203, and a source thereof connected to the potential GND of a substrate. A gate of the nMOS transistor N203 is connected to a sense amplifier activation signal SAE (that is set to the power-supply potential of the power supply VDD when the sense amplifier 803 is activated). A gate of the nMOS transistor N204 is connected to the control signal RSE. The node SAT is connected to an input terminal of an inverter 812. An output terminal of the inverter 812 is connected to a gate of an nMOS transistor N205 with a drain thereof connected to a data output line DL and a source thereof grounded (or set to the substrate potential GND). The node SAN is connected to an input terminal of an inverter 813. When the sense amplifier activation signal SAE is set to the power supply voltage VDD and when the sense amplifier 803 is activated, the pMOS transistors P201 and P202, nMOS transistors N201 and N202 constitute a latch circuit. Then, an amplification operation as follows is performed: through an on-state transistor of the pMOS transistors P201 and 202 (the transistor with a gate thereof connected to one of the nodes SAT and SAN on a lower voltage side), the node on a higher voltage side is charged to the power supply voltage VDD. Through an on-state transistor of the nMOS transistors N201 and N202 (the transistor with a gate thereof connected to one of the nodes SAT and SAN on the higher voltage side), the node on the lower voltage side is discharged to the substrate potential GND.

When a read operation is performed, data stored in a selected memory cell (not shown) in the memory cell array 801 is output to a bit line pair BLT and BLN to which the selected memory cell is connected, and the potential difference $\Delta V_{b1}$ is generated between the bit line pair BLT and BLN after a certain time. In the bit line pair selection circuit 802, the bit line pair selection signal /YS is set to a low level (or the substrate potential GND), the pMOS transistors P104 and P105 are turned on, and the potential difference $\Delta V_{b1}$ between the selected the bit line pair BLT and BLN is transferred to the nodes SAT and SAN in the sense amplifier 803.

When the sense amplifier activation signal SAE is set to a high level (or the power supply voltage VDD), the sense amplifier 803 amplifies the potential difference $\Delta V_{b1}$ between the nodes SAT and SAN and outputs read data to the data output line DL. When the node SAT is at the substrate potential GND, an nMOS transistor N205 that receives an output of the inverter 812 (at the power supply voltage VDD) is turned on. Then, the data output line DL is set to the substrate potential from the power supply voltage VDD. On the other hand, when the node SAT is at the power supply voltage VDD, the output of the inverter 812 is set to the substrate potential VDD. Then, the nMOS transistor N205 is turned off, so that the data output line DL is held at the power supply voltage VDD.

When a write operation is performed, the write control signal /WE is set to the low level (or the substrate potential GND). Then, in the bit line pair selection circuit 802, values of the write data signal lines WDT and WDN are output to the bit line pair BLT and BLN selected by the bit line pair selection signal /YS that is in an active state. That is, when the bit line pair selection signal /YS is at a low level and the write control signal /WE is at a low level, an output of the NOR circuit 811 becomes the high level (or the power supply voltage VDD). The nMOS transistors N101 and N102 that receive the output of the NOR circuit 811 are both turned on. Then, signal levels of a pair of the complementary write data signal lines WDT and WDN are transferred to the bit line pair BLT and BLN, respectively.

When the read operation or the write operation is completed, the pre-charge control signal PC is set to the low level. The pMOS transistors P101 to P103 are then turned on, and the bit line pair BLT and BLN is charged to the power supply voltage VDD.

Non-patent Document 1:
"A 2-GHz cycle, 430-ps access time 34-kb L1 directory SRAM in 1.5 V, 0.18-um CMOS bulk technology", R. V. Joshi, 2000 Symposia on VLSI circuit, pp. 222-225

DISCLOSURE OF THE INVENTION

Problems to be Solved by the Invention

By the way, when the finer geometries are achieved and the number of memory cells per bit line is also reduced using a conventional sensing circuit shown in Non-patent document 1, a problem arises that the delay time cannot effectively be reduced.

This problem occurs because due to a decrease in the number of the memory cells per bit line, a proportion of the capacitance of the sensing circuit to the entire capacitance of the bit lines has increased. This occurs because in the conventional sensing circuit of a semiconductor storage device, in order to reduce the potential difference between the bit line pair $\Delta V_{b1}$ as much as possible, the size of a transistor constituting the latch of the sense amplifier is set to be several tens of times that of a memory cell transistor, so that the capacitance of the bit lines for which the number of the memory cells has been reduced becomes substantially the same as the capacitance of the sense amplifier.

Further, existences of a diffusion capacitance $C_{ys}$ of a pn-junction in the bit line pair selection circuit 802 and an on-resistance R of the transistors (such as the transistors N101, N102, P104, and P105) in the bit line pair selection circuit 802 also become a factor for preventing a high-speed operation.

Assuming that a memory cell diffusion capacitance and a bit line wiring capacitance are $C_{b1}$, the diffusion capacitance of the bit line pair selection circuit 802 is $C_{ys}$, the capacitance of the sense amplifier 803 is $C_{sa}$, and that the on-resistance of the transistors (N101, N102, P104, and P105) of the bit line pair selection circuit 802 is R, the bit line delay time $t_{b1}$ in the above expression (2) is given by the following expression (3).

$$t_{b1} = C_{b1a} \cdot \Delta_{b1}/I_{ce11} + R \cdot C_{b1} \cdot (C_{ys}+C_{sa})/C_{b1a} \quad (3)$$

where $C_{b1a} = C_{b1}+C_{ys}+C_{sa}$

When the sizes of the transistors in the bit line pair selection circuit 802 are increased to reduce the on resistance R of the transistors, the diffusion capacitance $C_{ys}$ will increase. Thus, the value of the first term of the above expression (3) will increase.

Further, when the sizes of the transistors in the bit line pair selection circuit 802 are reduced to reduce the diffusion capacitance $C_{ys}$, the value of the on-resistance R of the transistors will increase. Thus, the value of the second term of the above expression (3) will increase.

As shown in the above-mentioned results of study, existence of the bit line pair selection circuit 802 and inability to reduce the sizes of the transistors in the sense amplifier 803 place a constraint on reduction of the bit line delay time. Meanwhile, this problem is clarified based on the above-mentioned results of study by the inventor of the present invention.

Accordingly, it is an object of the present invention to provide a semiconductor storage device that uses a novel design system in which while suppressing an increase in a chip area, a bit line delay time is reduced, thereby achieving a higher-speed operation of the device.

Means to Solve the Problem

The above and other objects are attained by a semiconductor storage device according to a first aspect of the present invention, which eliminate a conventional bit line pair selection circuit and reduce a bit line delay, comprises:

a memory cell array including a plurality of memory cells respectively disposed at intersections between a plurality of bit line pairs and a plurality of word lines disposed in a direction orthogonal to the bit line pairs;

a plurality of per-bit sensing circuits respectively connected to each of the bit line pairs;

each of the per-bit sensing circuits including:

a first circuit connected to a corresponding one of the bit line pairs, for setting voltages at the corresponding one of the bit line pairs to a first level when a bit line pair selection signal received is inactive;

a second circuit connected to the corresponding one of the bit line pairs and setting the corresponding one of the bit line pairs to mutually complementary levels according to a signal read onto the corresponding one of the bit line pairs from a selected memory cell when the bit line pair selection signal is made active and an input sensing circuit activation signal is also active; and a third circuit connected to the corresponding one of the bit line pairs, for receiving a write data signal, and setting one bit line of the corresponding one of the bit line pairs set in common to the first level to a second level complementary with the first level, based on the write data signal, when the bit line pair selection signal is active, thereby setting complementary write data on the corresponding one of the bit line pairs; and a data output circuit for receiving respective one bit lines of the bit line pairs from the per-bit sensing circuits, and outputting data read to a selected bit line pair. In the present invention, the data output circuit may include:

a fourth circuit for outputting a first logic value when all of the bit lines received are at the first level and outputting a second logic value when at least one of the bit lines received is at the second level; and a fifth circuit for receiving an output signal of the fourth circuit and outputting read data to a data output line based on a value of the output signal.

Each of the per-bit sensing circuits in a semiconductor storage device according to the present invention includes:

a pre-charge circuit connected to a corresponding one of the bit line pairs, for setting the corresponding one of the bit line pairs to a first supply potential;

a first latch circuit connected to the corresponding one of the bit line pairs, for setting the other one bit line of the corresponding one of the bit line pairs to the first supply potential when one bit line of the corresponding one of the bit line pairs is set to a second power supply potential;

a second latch circuit connected to the corresponding one of the bit line pairs, for assisting setting of the one bit line of the corresponding one of the bit line pairs to the second power supply potential when the one bit line of the corresponding one of the bit line pairs is set to the second power supply potential; and a data write circuit connected to the corresponding one of the bit line pairs, for receiving a write data signal and setting the one bit line of the corresponding one of the bit line pairs to the second power supply potential according to value of the write data signal. Then, control of activation/deactivation of the pre-charge circuit, the data write circuit, and the second latch circuit may be performed according to a bit line pair selection signal received.

In the semiconductor storage device according to the present invention, the logic circuit of the data output circuit may include a plurality of fifth MOS transistors of a first conductivity type with gates thereof respectively connected to each of one bit lines of the bit line pairs;

sources of the fifth MOS transistors of the first conductivity type may be connected in common to the first power supply, and drains of the fifth MOS transistors of the first conductivity type may be connected to one node;

an MOS transistor of a second conductivity type for receiving the inverted signal of the sensing circuit activation signal at a gate thereof and an MOS transistor of the second conductivity type with a gate thereof connected to the data output line may be connected in parallel between the one node and the second power supply; and the one node may be connected to the output transistor at a gate thereof, the output transistor having a source thereof grounded and a drain thereof connected to the data output line. In the present invention, the data output circuit may be configured to input each of the one bit lines and each of the other bit lines of the bit line pairs of each of the per-bit sensing circuits and differentially output data read to a selected bit line pair.

In the semiconductor storage device according to the present invention, the data output circuit may include:

an auxiliary circuit that receives the sensing circuit activation signal, for setting the inverted signal of the sensing circuit activation signal to the second power supply potential when the sensing circuit activation signal is at the first supply potential.

In the semiconductor storage device according to the present invention, the memory cell array and the data output unit connected in common to the per-bit sensing circuits may constitute a basic block;

a plurality of first signal line groups may be spaced apart to one another, each of the first signal line groups being constituted from the word lines extended in parallel in one direction, the bit line pair selection signals extended in parallel in the one direction, and the sensing circuit activation signal and the inverted signal of the sensing circuit activation signal;

a plurality of second signal line groups may be spaced apart to one another, each of the second signal line groups being constituted from the data output line extended in a direction orthogonal to the one direction and the complementary lines for the write data signals; and the semiconductor storage device may include a basic bock array including the basic blocks provided at intersections between the first and second signal line groups in an array form.

Meritorious Effect of the Invention

According to the present invention, the sensing circuit of a novel configuration that does not use the bit line pair selection circuit used in a conventional semiconductor storage device is provided. With this arrangement, a delay caused by a diffusion capacitance and an on resistance in the bit line pair selection circuit is eliminated, so that a bit line delay time can be reduced.

According to the present invention, the number of control signals and transistors can be simultaneously reduced.

BRIEF DESCRIPTION OF THE DRAWINGS

FIG. 9A shows a conventional configuration, while

| EXPLANATION OF NUMERALS | |
|---|---|
| 101 | sensing circuit |
| 102 | memory cell array |
| 103, 203, 303 | per-bit sensing circuit |
| 104, 204, 304, 404 | data output unit |
| 105 | SRAM basic block |
| 106 | SRAM basic block |
| 107 | data |
| 108 | data input/output unit |
| 109 | control unit |
| 110 | semiconductor storage device |
| 801 | memory cell array |
| 802 | bit line pair selection circuit |
| 803 | sense amplifier |
| 811 | NOR circuit |
| 812, 813 | inverter |
| IV10 | inverter |

-continued

| EXPLANATION OF NUMERALS | |
|---|---|
| N1-N6, N7-N10, N61, N62, N101-N102, N201-N205 | nMOS transistor |
| P1-P5, P101-P105, P201-P205 | pMOS transistor |
| WL | word line |
| YS | bit line pair selection signal |
| SE | sensing circuit activation signal |
| /SE | inverted signal of sensing circuit activation signal |
| BLT and BLN | bit line pair |
| VDD | supply voltage |
| GND | substrate voltage |
| /BLT | node (output of multi-input NAND gate) |
| DL | data output line |
| WDT and WDN | write data signal line pair |

PREFERRED EMBODIMENTS OF THE INVENTION

Figure 1:
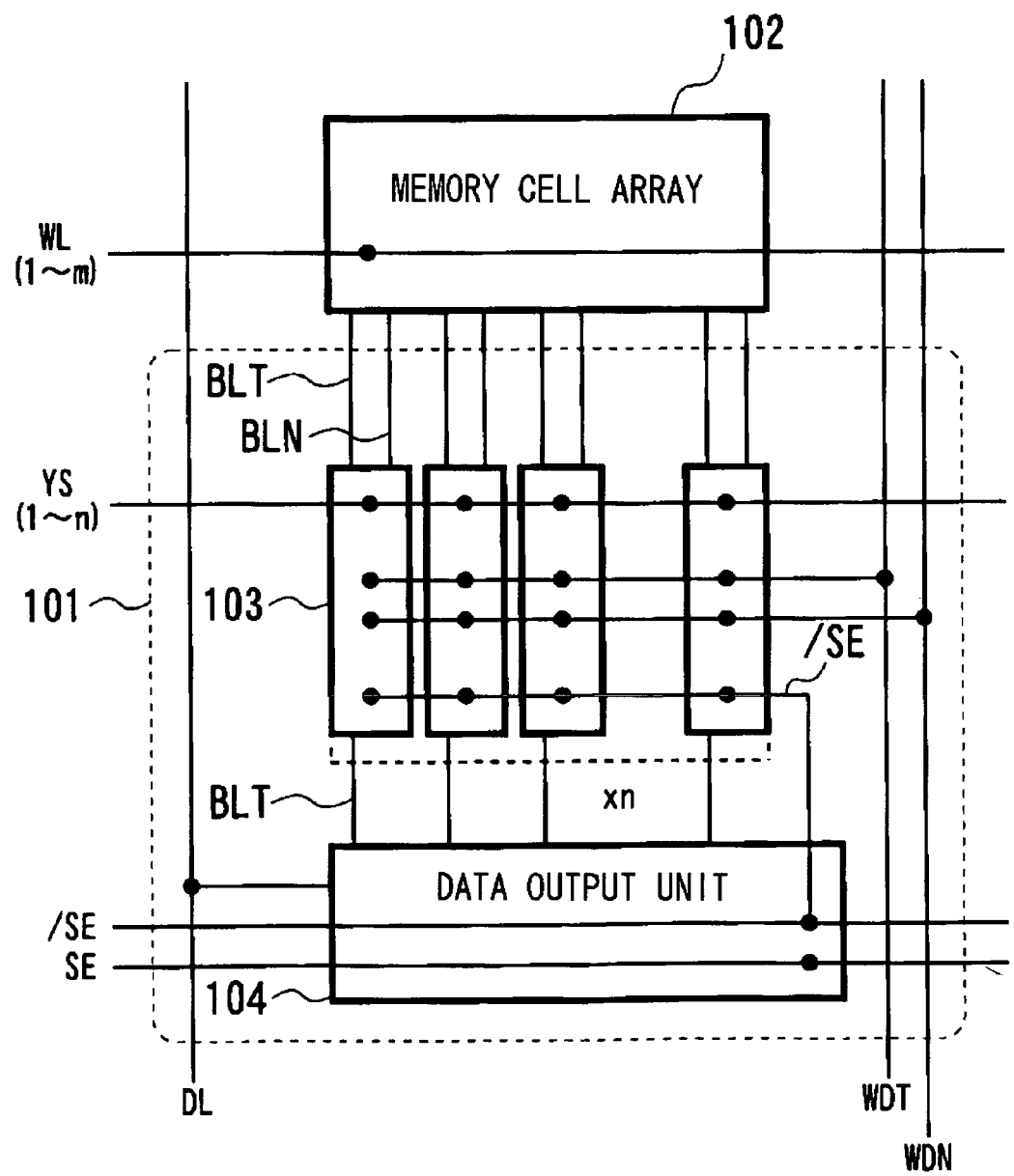
FIG. 1 is a diagram showing a configuration of a first embodiment of the present invention.

A best mode for carrying out the present invention will be described. Referring to FIG. 1, an embodiment mode of the present invention includes a memory cell array (102) having a plurality of bit line pairs (BLT and BLN), a plurality of word lines (WL), and a plurality of memory cells disposed at intersections between the bit line pairs and the word lines, respectively, a plurality of sensing circuits (103) (referred to as "per-bit sensing circuits" because the circuits are the sensing circuits provided for each bit line pair) connected to the bit line pairs, respectively, and one data output unit (104) provided for the per-bit sensing circuits (103). The data output unit (104) receives one bit line of the bit line pair from each of the per-bit sensing circuits (103), and outputs data read to a selected bit line pair to a data output line (DL). The memory array (102), the per-bit sensing circuits (103), and data output unit (104) constitute a basic block.

Figure 2:
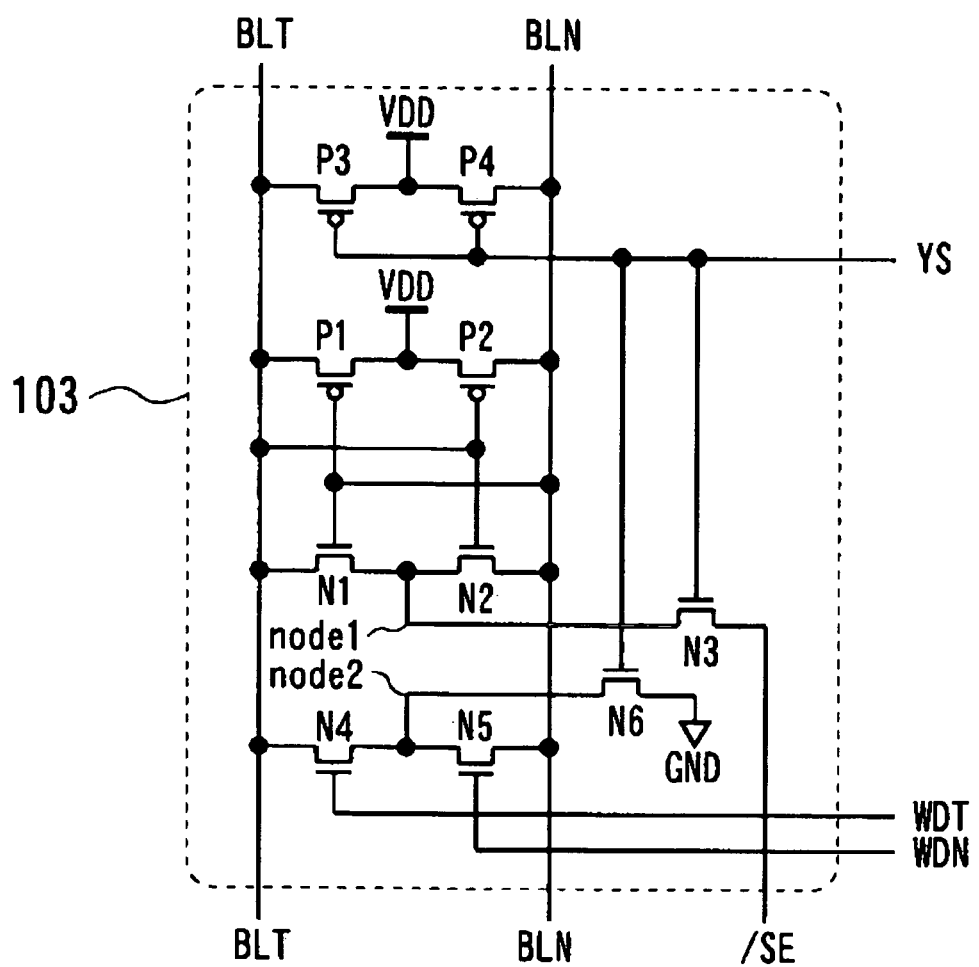
FIG. 2 is a diagram showing an example of a configuration of a per-bit sensing circuit in a sensing circuit according to the first embodiment of the present invention.

In the embodiment mode of the present invention, referring to FIG. 2, the per-bit sensing circuit (103) includes a pre-charge circuit, a circuit for performing amplification, and a data write circuit. The pre-charge circuit is connected to a bit line pair (BLT and BLN), and sets voltages at the bit line pair (BLT and BLN) to a first level (such as a supply voltage VDD) when a bit line pair selection signal received (YS) is inactive. The circuit for performing amplification is connected to the bit line pair (BLT and BLN). When the bit line pair selection signal (YS) is made active and when an input sensing circuit activation signal (SE) is active, the circuit for performing amplification sets the bit line pair (BLT and BLN) to mutually complementary levels (the power supply voltage VDD and a ground potential GND) according to a signal read onto the bit line pair (BLT and BLN) from a selected memory cell. The data write circuit is connected to the bit line pair (BLT and BLN) and receives a write data signal pair (WDT and WDN). When the bit line pair selection signal (YS) is active, the data write circuit sets one of the bit line pair (BLT and BLN) pre-charged to the first level to a second level (such as the ground potential GND) that is complementary with the first level, based on the write data signals, thereby setting complementary write data on the bit line pair (BLT and BLN).

In the embodiment mode of the present invention, the data output circuit includes a logic circuit and an output transistor. When all of the bit lines input from the per-bit sensing circuits are at the first level, the data output circuit outputs a first logic value. When at least one of the bit lines is at the second level, the data output circuit outputs a second logic value. The output transistor inputs an output signal of the logic circuit, and outputs read data to the data output line (DL) based on the value of the output signal.

When a more detailed description is given at a transistor level, referring to FIG. 2, the per-bit sensing circuit (103) in the embodiment mode of the present invention includes:

(A1) the pre-charge circuit constituted from first and second MOS transistors of a first conductivity type (P3 and P4) with sources thereof connected in common to a first power supply (VDD) and drains thereof connected to the pair of the bit lines, respectively, and gates thereof connected to the bit line pair selection signal (YS);

(A2) a first latch circuit constituted from third and fourth MOS transistors of the first conductivity type (P1 and P2) with sources thereof connected in common to the first power supply, drains thereof connected to the first and second bit lines (BLT and BLN) constituting the bit line pair, respectively, and gates thereof cross-connected to the second and first bit lines (BLN and BLT), respectively;

(A3) a second latch circuit including first and second MOS transistors (N1, N2) of a second conductivity type with drains thereof connected to the first and second bit lines (BLT and BLN) constituting the bit line pair, respectively, gates thereof cross-connected to the second and first bit lines (BLN and BLT), respectively, and sources thereof connected in common, and a third MOS transistor (N3) of the second conductivity type connected between a common connecting node between the sources of the first and second MOS transistors and an inverted signal (/SE) of the sensing circuit activation signal, with a gate thereof connected to the bit line pair selection signal (YS), for being subject to on/off control; and (A4) the data write circuit including fourth and fifth MOS transistors (N4 and N5) of the second conductivity type with drains thereof connected to the first and second bit lines (BLT and BLN) constituting the bit line pair, gates thereof connected to a pair of lines for the complementary write data signals (WDT and WDN), respectively, and sources thereof connected in common, and a sixth MOS transistor (N6) of the second conductivity type connected between a common connecting node between the sources of the fourth and fifth MOS transistors and the second power supply potential (GND), with a gate thereof connected to the bit line pair selection signal (YS), for being subject to on/off control.

In the present embodiment mode, the logic circuit of the data output circuit (104) is constituted from a multi-input negative AND (NAND) gate of a dynamic type. That is, when all the bit lines from the per-bit sensing circuits are at the first supply potential (VDD), the logical level of an output node (/BLT) is made low. The output transistor (N9) with a source thereof grounded, a drain thereof connected to the data output line (DL), and a gate thereof connected to an output node of the NAND gate is thus turned off. On the other hand, when at least one of the bit lines (a selected bit line) is at the second power supply potential, the output node (/BLT) of the NAND gate becomes high. The output transistor (N9) is thereby turned on, and the data output line DL is discharged to the second power supply potential (GND).

In the present embodiment mode, the data output circuit (104) includes an auxiliary circuit (N10) for receiving the sensing circuit activation signal SE and setting the inverted signal of the sensing circuit activation signal (/SE) to the second power supply potential (GND) when the sensing circuit activation signal is at the first supply potential (VDD).

In the present embodiment mode, the logic circuit of the data output circuit (104) includes a plurality of fifth MOS transistors (P5) of the first conductivity type with gates thereof connected to one bit lines of the pairs of the bit lines. Sources of the fifth MOS transistors of the first conductivity type are connected in common to the first power supply VDD, and drains of the fifth MOS transistors are connected in common to the one node (/BLT). Between the one node and the second power supply GND, a seventh MOS transistor (N7) of the second conductivity type which inputs the inverted signal of the sensing circuit activation signal at a gate thereof and an eighth MOS transistor (N8) of the second conductivity type with a gate thereof connected to the data output line are connected in parallel with each other.

In the present embodiment mode, the data write circuit for discharging one bit line of the selected pair of the bit lines to the potential of a substrate (GND: ground potential) at a time of a write operation is controlled by the bit line pair selection signal (YS), sensing circuit activation signal /SE, and pair of the write data signal lines WDT and WDN.

The second latch circuit for accelerating a discharging operation on one bit line of the selected pair of the bit lines to be discharged due to a memory cell at a time of a read operation is controlled by the bit line pair selection signal (YS) and the sensing circuit activation signal (/SE). The data output circuit (104) is controlled by the sensing circuit activation signal /SE.

This embodiment mode includes a basic block array. The basic block array is constituted by including a first signal line group, a second signal line group, and a basic block array. The first signal line group is constituted from the word lines (WL) extended in parallel in one direction, the bit line pair selection signals (YS) extended in parallel in the one direction, and the sensing circuit activation signals (SE) and the inverted signals thereof (/SE). The word lines, the bit line pair selection signals, and the sensing circuit activation signals and the inverted signals of the sensing circuit activation signals are spaced apart to one another. The second signal line group is constituted from the data output lines (DL) and the pairs of the complementary write data signal lines (WDT and WDN) which are extended in a direction orthogonal to the one direction, and spaced to one another. At intersections between the first and second signal line groups, the basic blocks (105) are included in an array form.

Embodiments

Embodiments of the present invention will be described below in detail with reference to drawings. FIG. 1 is a diagram showing a basic configuration of a static random access memory (SRAM) according to a first embodiment of the present invention. The basic configuration of the SRAM is configured by including a sensing circuit 101 for performing an n-to-one bit line pair selection (selection of one bit line pair from n bit line pairs) and the memory cell array 102 having a plurality (m) of word lines WL and n plural (n pairs of) bit line pairs. A memory cell not shown in the memory cell array 102 includes a flip-flop constituted by cross connecting inputs and outputs of two inverters and two pass transistors (also referred to as "access transistors") connected between a connecting node of the inputs and the outputs of the two inverters and respective bit lines of a bit line pair. Gates of the two pass transistors are connected in common to a word line.

The sensing circuit 101 includes n per-bit sensing circuits 103 each connected to a bit line pair BLT and BLN and the data output unit 104 connected to the bit line BLT from each of the per-bit sensing circuits 103.

The per-bit sensing circuits 103 are connected to the bit line pair selection signal YS. Activation of the per-bit sensing circuits 103 is controlled by the sense amplifier activation signal /SE. The per-bit sensing circuits are connected to the pair of complementary write data signal lines WDT and WDN. The data output unit 104 is connected to the data output line DL sensing circuit activation signal SE, and inverted signal SE thereof.

FIG. 2 is a diagram showing an example of a circuit configuration of the per-bit sensing circuit 103 in FIG. 1. Referring to FIG. 2, the per-bit sensing circuit 103 includes the pMOS transistors P3 and P4, pMOS transistors P1 and P2, nMOS transistors N1 and N2, transistor N3, nMOS transistors N4 and N5, and nMOS transistor N6. The pMOS transistors P3 and P4 have sources connected in common to the power supply VDD, have drains connected to the bit lines BLT and BLN, respectively, and have gates connected in common to the bit line pair selection signal YS. The pMOS transistors P1 and P2 have sources connected in common to the power supply VDD, have drains connected to the bit line pair BLT and BLN, respectively, and have gates are cross-connected to the bit lines BLN and BLT, respectively. The nMOS transistors N1 and N2 have drains connected to the bit line pair BLT and BLN, respectively, and have gates cross-connected to the bit lines BLN and BLT, respectively. The transistor N3 has a drain connected to a common connecting point between the sources of the nMOS transistors N1 and N2, has a source connected to the inverted signal /SE of the sensing circuit activation signal, and has a gate connected to the bit line pair selection signal YS. The nMOS transistors N4 and N5 have drains connected to the bit line pair BLT and BLN, respectively, and have gates connected to the pair of the write data signal lines WDT and WDN. The nMOS transistor N6 has a drain connected to the common connecting point between the sources of the nMOS transistors N4 and N5, has a source grounded (or connected to the substrate potential GND), and has a gate connected to the bit line pair selection signal YS.

When the bit line pair selection signal YS is inactive (at a low level), or when the bit line pair BLT and BLN is not selected, the pMOS transistors P3 and P4 charge the bit line pair BLT and BLN to the power supply voltage VDD.

When one of the selected bit line pair BLT and BLN is discharged to the substrate potential GND due to a memory cell, the pMOS transistors P1 and P2 sets the other of the bit line pair BLT and BLN to the power supply voltage VDD.

When a read operation is performed, the nMOS transistors N1 and N2 accelerate a discharging operation on one bit line of the selected bit line pair BLT and BLN to be discharged due to the selected memory cell. When one bit line BLT of the selected bit line pair BLT and BLN is assumed to be discharged, the nMOS transistor N1 with the gate thereof connected to the other bit line BLN of the selected bit line pair BLT and BLN is turned on. The one bit line BLT is electrically connected to the sensing circuit activation signal /SE at the substrate potential GND and set to the substrate potential GND through the nMOS transistors N1 and N3 in an on state.

When a write operation is performed, the nMOS transistors N4 and N5 discharge one bit line of the selected bit line pair BLT and BLN to the substrate potential GND. When one write data signal line WDT of the write data signal line pair is at the power supply voltage VDD and the other write data signal line WDN is at the substrate potential GND, the nMOS transistor N4 is turned on, and the nMOS transistor N5 is turned off. Then, the bit line BLT is set to the substrate potential (GND) through the nMOS transistors N4 and N6.

Figure 3:
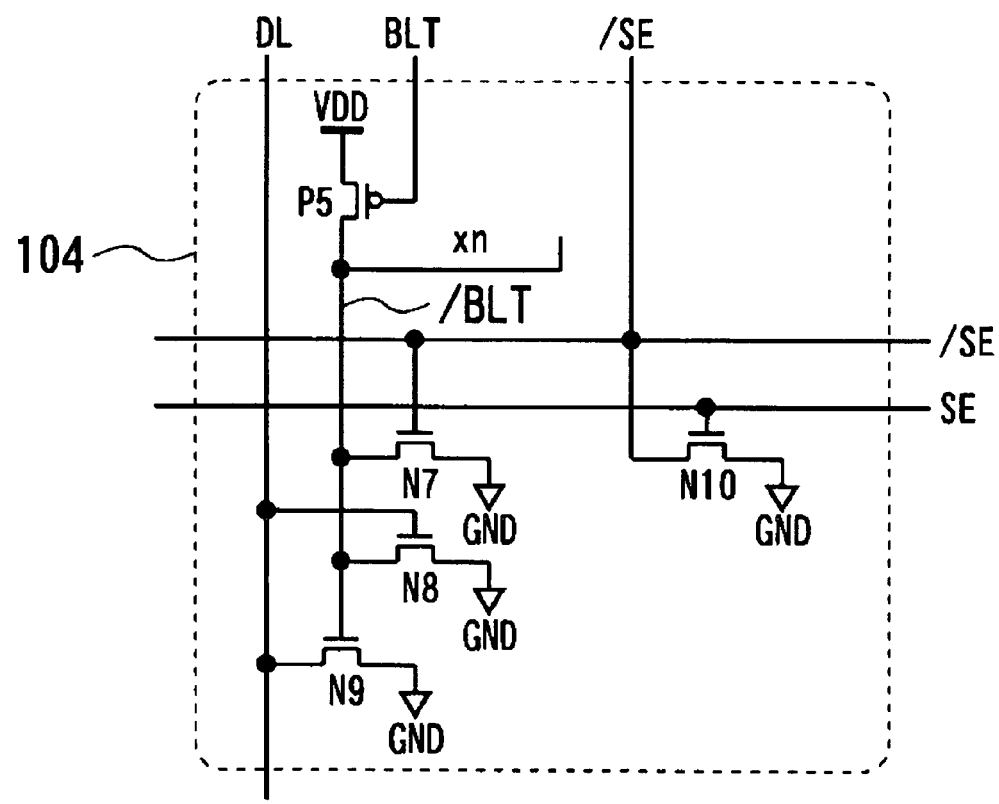
FIG. 3 is a diagram showing an example of a configuration of a data output circuit in the sensing circuit according to the first embodiment of the present invention.

FIG. 3 is a diagram showing an example of a circuit configuration of the data output circuit 104 for performing the n-to-one bit line pair selection at a time of the read operation. Referring to FIG. 3, the data output circuit 104 includes the pMOS transistor P5, an nMOS transistor N9, the nMOS transistor N7, the nMOS transistor N8, and the nMOS transistor N11. The pMOS transistor P5 has a source connected to the power supply VDD, has a gate connected to the bit line BLT, and has a drain connected to the node /BLT. The nMOS transistor N9 has a gate connected to the node /BLT, has a source grounded and has a drain connected to the data output line DL. The nMOS transistor N9 constitutes an output circuit (inverted amplifier circuit). The inverted signal /SE of the sensing circuit activation signal SE is supplied to the gate of the nMOS transistor N7. The nMOS transistor N7 has a drain connected to the node /BLT, and has a source connected to the substrate potential GND. The nMOS transistor N8, which is connected in parallel with the nMOS transistor N7 between the node /BLT and the substrate potential GND, has a gate connected to the data output line DL. The nMOS transistor N10, which is connected between the inverted signal /SE of the sensing circuit activation circuit SE and the substrate potential GND, has a gate connected to the bit line pair selection signal SE. The drains of n pieces of pMOS transistors P5 provided corresponding to n bit lines BLT from the n pieces of per-bit sensing circuits 103 are connected in common to the node /BLT. The sources of the n pieces of pMOS transistors P5 are connected in common to the power supply VDD. Incidentally, in FIG. 3, one pMOS transistor P5 is shown for simplicity of the description, and pMOS transistors P5 connected in parallel between the power supply VDD and the node /BLT is indicated as "xn".

The nMOS transistor N10 is turned on when the sensing circuit activation signal SE is activated (to the power supply voltage VDD), and assists discharging of the inverted signal /SE of the sensing circuit activation signal. The nMOS transistor N10 sets the inverted signal /SE of the sensing circuit activation signal to the substrate potential GND.

The pMOS transistor P5 outputs inverted data of the potential of one bit line BLT of a selected bit line pair to the node /BLT. When the bit line BLT is at a low level, the pMOS transistor P5 is turned on, and drives the node /BLT to the power supply voltage VDD. When the bit line BLT is at a high level, the pMOS transistor P5 is turned off, and the node /BLT is set to the substrate potential GND. When all of the n bit lines BLT are at a high level (or at the power supply voltage VDD), the node /BLT is set to the substrate potential GND, the nMOS transistor N9 is turned off, and the data output line DL is kept at the power supply voltage VDD. When the bit line BLT of the selected bit line pair is at a low level, the node /BLT is set to the power supply voltage VDD, the nMOS transistor N9 is turned on, and the data output line DL is set to the substrate potential GND.

The n pMOS transistors P5, nMOS transistors N7 and N8 constitute an n-input NAND gate of a dynamic type. A logic gate of the dynamic type refers to a circuit for implementing a logical function by storing electric charge in a node that is not connected to a power supply.

The nMOS transistor N7 is turned on when the inverted signal /SE of the sensing circuit activation signal is at a high level (or at the power supply voltage VDD), and discharges the node /BLT to the subtrate potential GND.

The nMOS transistor N8 prevents the node /BLT from becoming a floating state when the potential of a bit line selected at a time of activation of the sensing circuit is the power supply voltage VDD. When the selected bit line BLT is at the power supply voltage VDD (with the data output line DL being at the power supply voltage VDD), the nMOS transistor N8 is turned on to set the node /BLT to the substrate potential GND, and the transistor N9 is turned off.

Figure 4:
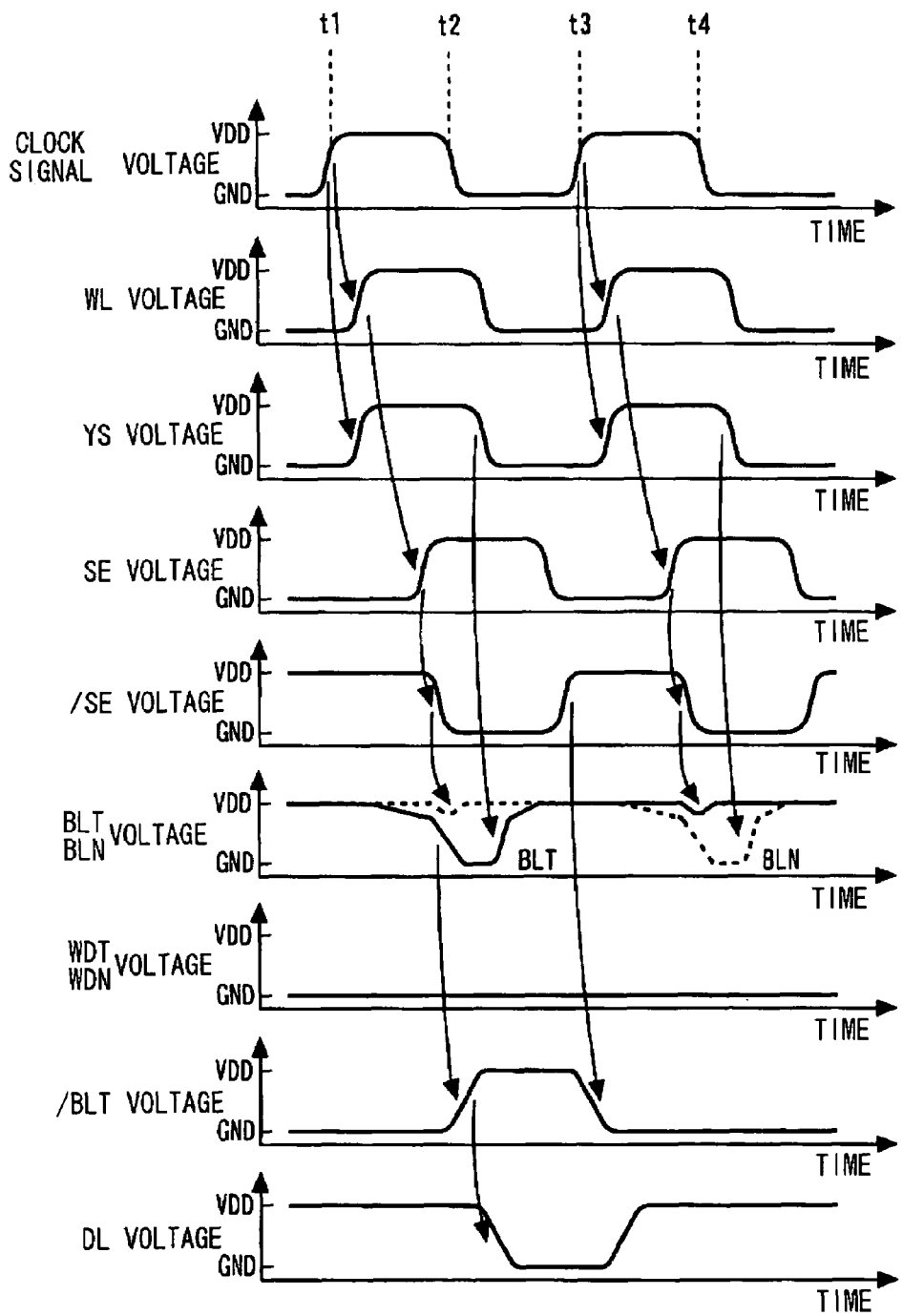
FIG. 4 is a timing chart for explaining an example of a read operation by the sensing circuit in the first embodiment of the present invention.

FIG. 4 is a timing chart explaining a read operation from a basic block 105 of the SRAM according to the present embodiment. FIG. 4 shows voltage waveforms of a clock signal, the word line WL, the bit line pair selection signal YS, the sensing circuit activation signal SE and the signal /SE, the bit line pair BLT and BLN, the pair of the complementary write data signal lines WDT and WDN, node /BLT, and data output line DL. The present embodiment shows the SRAM of a clock synchronous type. The clock in FIG. 4 corresponds to a clock signal in FIG. 6 which will be described later, and is an internal clock signal generated based on an external clock signal for synchronization supplied from an outside of a semiconductor storage device. A read operation in the present embodiment will be described with reference to FIGS. 2 through 4.

At a time of the read operation, one word line WL selected from the m word lines is activated in synchronization with a rising edge of the clock signal at a time t1, and the word line WL is raised from the substrate potential GND to the power supply voltage VDD. At the same time, the signal YS for selecting one bit line pair from among the n bit line pairs is activated to (the power supply voltage VDD). In the per-bit sensing circuit 103 shown in FIG. 2, the pMOS transistors P3 and P4 are turned off, and the nMOS transistor N6 is turned on. By the activation of the selected word line WL and turning off of the pMOS transistors P3 and P4, one bit line of the bit line pair BLT and BLN which has been pre-charged to the power supply voltage VDD is discharged based on the value of cell data.

After a predetermined time from the activation of the word line WL, the sensing circuit activation signal SE is activated, (thereby rising to the power supply voltage VDD). The inverted signal /SE of the sensing circuit activation signal falls to the substrate potential GND from the power supply voltage VDD.

This accelerates a discharging operation of one bit line out of the bit line pair BLT and BLN through the MOS transistor N3 that has been turned on in advance and one of the transistors N1 and N2, which has a gate connected to the bit line at the power supply voltage, in the per-bit sensing circuit 103 in FIG. 2.

Then when the bit line to be discharged is the bit line BLT, the pMOS transistor P5 is turned on in the data output unit 104, so that the node /BLT is raised from the substrate potential GND to the power supply voltage VDD. This turns on the nMOS transistor N9, so that the data output line DL lowered from the power supply voltage VDD to the substrate potential GND. The read operation is executed by steps described above.

Next, when the word line WL and the bit line pair selection signal YS are lowered from the power supply voltage VDD to the substrate potential GND in synchronization with a fall transition of the clock signal at a time t2 in FIG. 4, the pMOS transistors P3 and P4 in the per-bit sensing circuit 103 in FIG. 2 are turned on. The one bit line of the bit line pair BLT and BLN that has been discharged is raised from the substrate potential GND to the power supply voltage VDD. When the sensing circuit activation signal SE is lowered from the power supply voltage VDD to the substrate potential GND after a predetermined time, the inverted signal /SE thereof is raised from the substrate potential GND to the power supply voltage VDD. Then, the nMOS transistor N7 is turned on, the node /BLT is initialized to the substrate potential GND, and the transistor N9 is turned off. Incidentally, a period from the time t1 to a time t3 form one read cycle.

On the other hand, as shown in the read cycle starting from the time t3 in FIG. 4, when the sensing circuit activation signal SE is activated (when the sensing circuit activation signal SE is raised to the power supply voltage VDD), and when the discharged bit line of the bit line pair is the bit line BLN (when the bit line BLT is at the power supply voltage), the pMOS transistor P5 in the data output unit 104 in FIG. 3 is turned off, and the transistor N7 is turned on. Thus, the node /BLT is kept at the substrate potential GND. This turns off the transistor N9, and the data output line DL is held at the power supply voltage VDD. At this point, the nMOS transistor N8 is also turned on, so that the node /BLT is held at the substrate potential GND.

Figure 5:
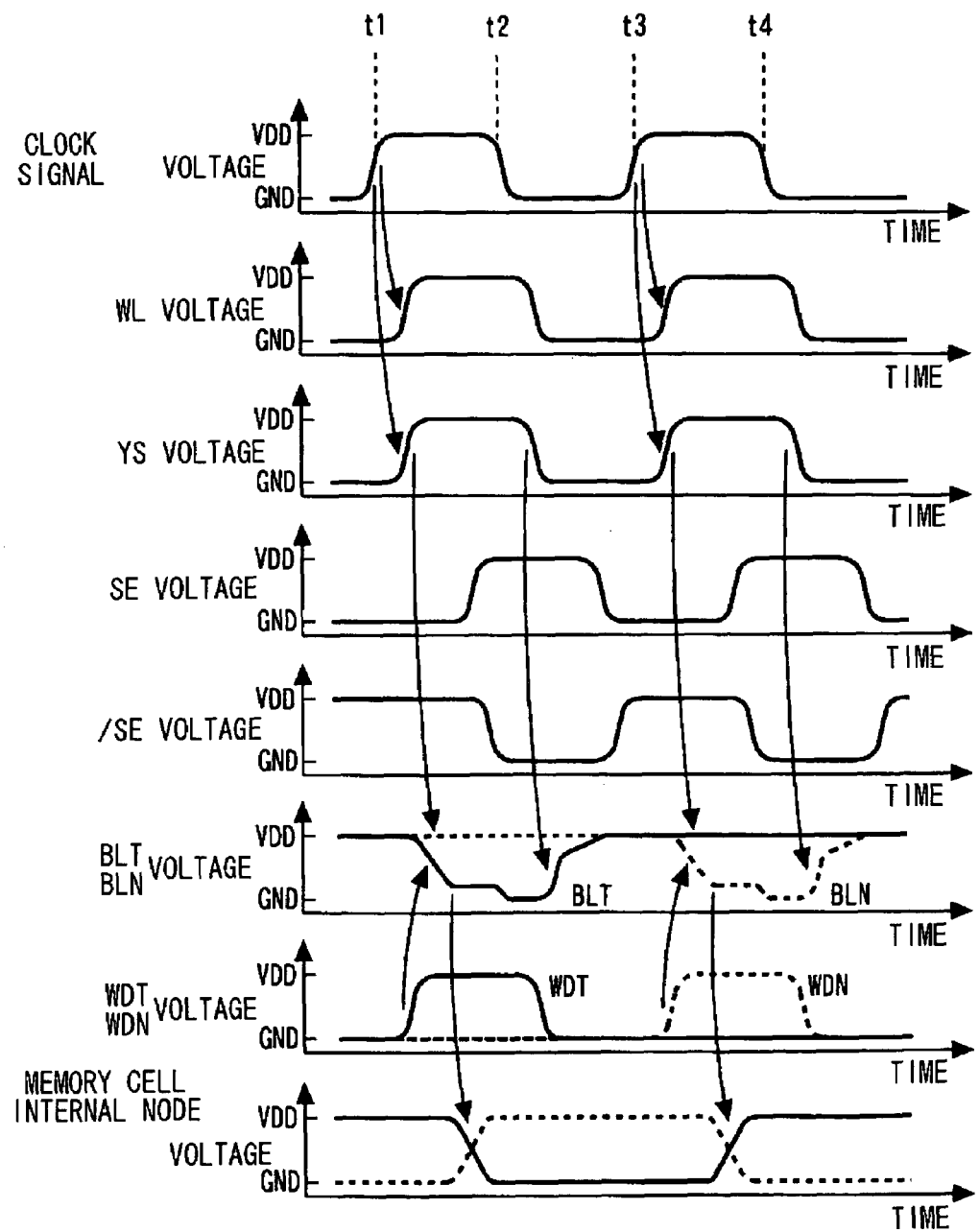
FIG. 5 is a timing chart for explaining an example of a write operation by the sensing circuit in the first embodiment of the present invention.

FIG. 5 is a timing chart showing a write operation in the present embodiment. Referring to FIG. 5, at a time of the write operation, an operation of activating one of the write data signal lines WDT and WDN according to write data, in synchronization with the clock signal, is added to the read operation described with reference to FIG. 4.

Referring to FIG. 5, in a period from activation of the word line signal WL and the bit line pair selection signal YS in synchronization with a rise transition of the clock signal at a time t1 to activation of the sensing circuit activation signal SE, one of the pair of the complementary write data signal lines WDT and WDN is activated according to write data. This turns on the transistor N6 in the per-bit sensing circuit 103, one of the transistors N4 and N5 with the gate thereof connected to the write data signal line at a high level is turned on, and one of the bit line pair BLT and BLN connected to the transistor in the on state is discharged to the substrate potential GND.

When the one of the bit line pair BLT and BLN is discharged to a certain potential or less, the write data is supplied to the node of a selected memory cell (the input/output node of the flip-flop). A write operation is executed by steps described above.

Then, when the word line WL and the bit line pair selection signal YS are lowered from the power supply voltage VDD to the substrate potential GND in synchronization with a fall of the clock signal at a time t2 in FIG. 5, the pMOS transistors P3 and P4 in the per-bit sensing circuit 103 in FIG. 2 are turned on. The one bit line of the bit line pair BLT and BLN that has been discharged is raised from the substrate potential GND to the power supply voltage VDD (with the other remaining at the power supply voltage VDD), so that a pre-charging operation is performed. When the sensing circuit activation signal SE is lowered from the power supply voltage VDD to the substrate potential GND after a predetermined time, the inverted signal /SE thereof is raised from the substrate potential GND to the power supply voltage VDD. Meanwhile, initialization of the respective signals in the write operation is performed in the same manner as in the read operation.

Figure 6:
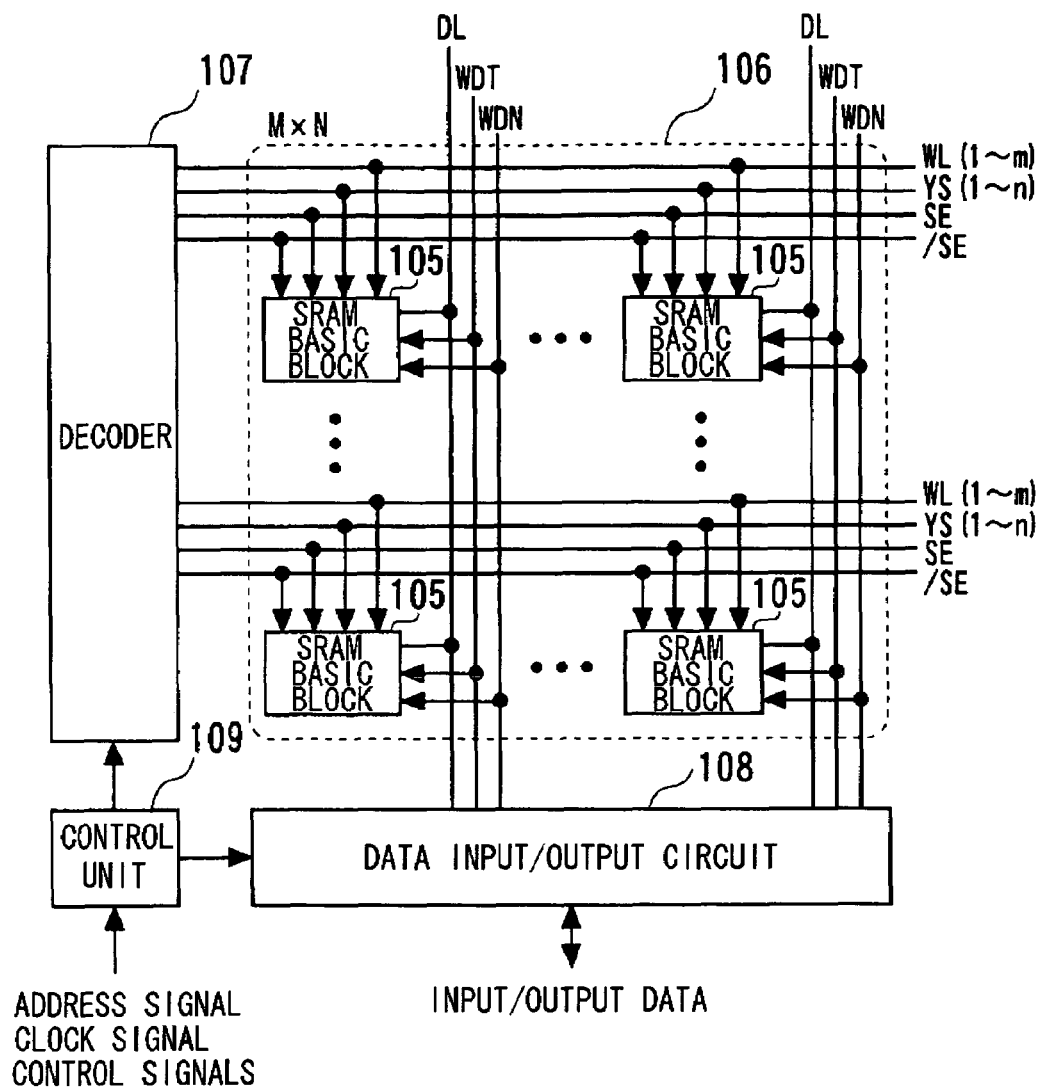
FIG. 6 is a block diagram showing a configuration of a semiconductor storage device including SRAM basic blocks in the first embodiment of the present invention.

FIG. 6 is a diagram showing a configuration of a semiconductor storage device 110 constituted by arranging a plurality of SRAM basic blocks 105, one of which was described with reference to FIGS. 1 through 5. The semiconductor storage device 110 includes M first signal line groups, N second signal line groups, and an SRAM basic block array 106. Each of the M first signal line groups is constituted from the plurality (m) of the word lines WL (1 to m) extended in parallel in a horizontal direction of the drawing, the plurality (n) of the bit line pair selection signals YS (1 to n) extended in parallel in the horizontal direction, and the sensing circuit activation signal SE and the inverted signal /SE thereof extended in parallel in the horizontal direction. The M first signal line groups are separated to one another. Each of the N second signal line groups is constituted from the data output line DL and the pair of the complementary write data signal lines WDT and WDN, extended in a vertical direction of the drawing. The N second signal line groups are separated to one another. The SRAM block array 106 is constituted by including M×N SRAM basic blocks 105 provided at intersections between the first signal line groups and the second signal line groups. The semiconductor storage device 110 further includes a decoder 107, a data input/output unit 108, and a control unit 109. The decoder 107 is connected to the word lines WL, bit line pair selection signals YS, sensing circuit activation signals SE, inverted signals /SE of the sensing circuit activation signals, and controls an operation of the SRAM basic block array 106. The data input/output unit 108 is connected to the pairs of the write data signal lines WDT and WDN, and the data output signal lines DL. The data input/output unit 108 performs control over a write operation of the SRAM basic block array 106 and performs data input and output. The control unit 109 inputs an address signal, the clock signal and control signals and controls the decoder 107 and the data input/output unit 108. The decoder 107 includes a row decoder for decoding a row address and activating a selected word line and a column decoder for decoding a column address and activating the bit line pair selection signal YS associated with a selected bit line pair. The control unit 109 performs control of a read/write operation over the decoder 107 and the data input/output circuit 108 based on the control signal, generates a strobe signal for activating the selected word line in synchronization with the clock signal or the like, and controls timings of activating the bit line pair selection signal YS and the sensing circuit activation signal SE. Incidentally, in the SRAM of the clock synchronization type, latching of the address signal, write data signal, and control signals which are supplied from the outside, and output of a read data signal to the outside are performed in synchronization with the clock signal.

Figure 7:
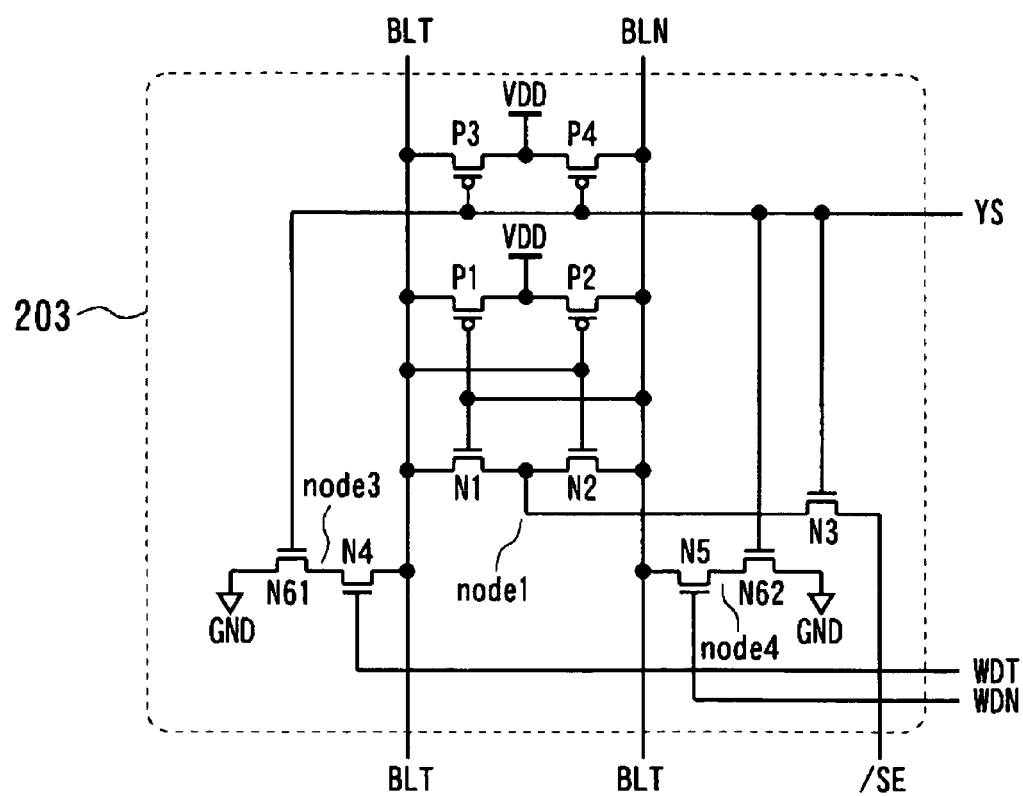
FIG. 7 is a diagram showing an example of a configuration of a per-bit sensing circuit according to a second embodiment of the present invention.

FIG. 7 is a diagram showing an example of a circuit configuration of a per-bit sensing circuit 203 according to a second embodiment of the present invention. Referring to FIG. 7, in the per-bit sensing circuit 203 in the second embodiment of the present invention, the nMOS transistor N6 in the per-bit sensing circuit 103 in the above described embodiment shown in FIG. 2, is configured to be separated into two transistors N61 and N62. That is, the per-bit sensing circuit 203 includes an nMOS transistor N4, the nMOS transistor N61, an nMOS transistor N5, and the nMOS transistor N62. A drain of the nMOS transistor N4 is connected to the bit line BLT and a gate of the nMOS transistor N4 is connected to one write data signal line WDT of the write data signal line pair. A source of the nMOS transistor N61 is connected to the substrate potential GND, a gate of the nMOS transistor N61 is connected to the bit line pair selection signal YS. A drain of the nMOS transistor N61 is connected to a source of the nMOS transistor N4. A drain of the nMOS transistor N5 is connected to the bit line BLN, and to a gate of the nMOS transistor N5, the write data signal line WDN, which is the other one of the write data signal line pair, is connected. A source of the nMOS transistor N62 is connected to the substrate potential GND. A gate of the nMOS transistor N62 is connected to the bit line pair selection signal YS, and a drain of the nMOS transistor N62 is connected to a source of the nMOS transistor N5.

The order of the nMOS transistor N4 and the nMOS transistor N61 connected in series between the bit line BLT and the substrate potential GND may be of course exchanged, and the order of the nMOS transistor N5 and the nMOS transistor 62 connected in series between the bit line BLN and the substrate potential GND may be of course exchanged. That is, the circuit may be configured to include the nMOS transistor N61 with the drain thereof connected to the bit line BLT and the gate thereof connected to the bit line pair selection signal Y, the nMOS transistor N4 with a source thereof connected to the substrate potential GND, the gate thereof connected to the one write data signal line WDT of the write data signal line pair, and the drain thereof connected to the source of the nMOS transistor N61, the nMOS transistor N62 with the drain thereof connected to the bit line BLN and the gate thereof connected to the bit line pair selection signal YS, and the nMOS transistor N5 with a source thereof connected to the substrate potential GND, the gate thereof connected to the other write data signal line WDN of the write data signal line pair, and the drain thereof connected to the source of the nMOS transistor N62.

An operation and effect of the above-mentioned embodiment will be described.

In the present embodiment, by configuring the sensing circuit without using a bit line pair selection circuit employed in a conventional semiconductor storage device, a bit line delay time $t_{b1}$ can be reduced.

In a conventional sensing circuit, for example, in case wherein a capacitance $C_{bla}$ is set to 40 fF, a capacitance $C_{ys}$ is set to 20 fF, a capacitance $C_{sa}$ is set to 20 fF, a ratio $\Delta V_{b1}/I_{cell}$ is set to 1 KΩ, and a resistance R is set to 2 kΩ, the bit line delay $t_{b1}$ becomes 120 ps according to the above expression (3).

In the above embodiment, by eliminating a bit line pair selection circuit 802 used in the conventional semiconductor storage device, the diffusion capacitance $C_{ys}$ and the on resistance R can be eliminated. Thus, a higher-speed operation in which the bit line delay $t_{b1}$ is reduced to 60 ps is possible, according to the above expression (3). That is, the bit line delay can be substantially reduced to as little as half of the delay obtained with a conventional system.

Another operation and effect of the above embodiment is that the number of the control signals and the transistors can be reduced. The reason for that is that in the present embodiment, activation of the pre-charge circuit (P1 and P2) for fixing the bit line pairs that are not selected at the power supply voltage and the data write circuit (N4 and N5, and N6) for discharging one bit line of a selected bit line pair to the substrate potential at a time of a write operation, and a second latch circuit (N1, N2, and N3) for accelerating the discharging operation of the one bit line of the selected bit line pair to be discharged due to a memory cell at the time of the write operation is controlled by the same bit line pair selection signal YS. A CMOS gate for performing a logical operation on the control signals such as an NOR circuit 811 in FIG. 8 therefore becomes unnecessary. That is, in the present embodiment, the number of the transistors in the block per bit line pair becomes 11, which is the same number of the transistors as the conventional circuit. When an eight-to-one selection (selection of one pair from eight bit line pairs) is used in the sensing circuit as a whole, the number of the transistors can be reduced to 92 from 102 in the conventional semiconductor storage device.

Figure 8:
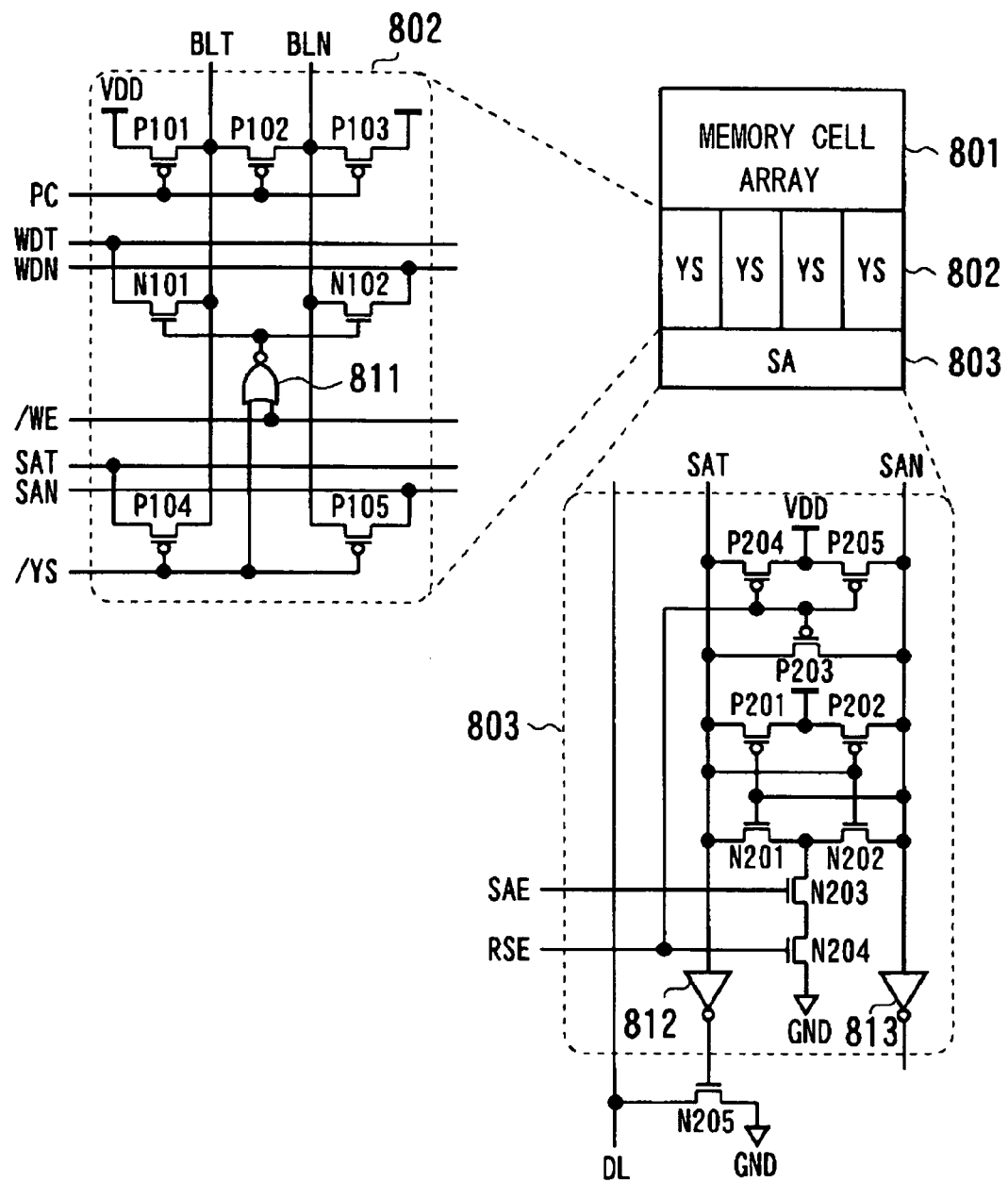
FIG. 8 is diagrams showing configurations of a conventional semiconductor storage device, a bit line pair selection circuit, and a sensing circuit, respectively.

While the number of the control signals is seven constituted from the clock signal, PC signal, signal /WE, signal /YS, signal SAE, signal RSE, and signal WDT (WDN) in the conventional semiconductor storage device shown in FIG. 8, the number of the control signals in the present embodiment is reduced to 4 constituted from the clock signal, signal YS, signal WDT(WDN), and signal /SE(SE).

In the above embodiment, a description was given to an example in which the present invention has been applied to the high-speed SRAM of the clock synchronization type. The sensing circuits in the embodiments described above (e.g. configurations in which the bit line selection circuit is eliminated, thereby reducing the bit line delay) can be of course applied to a read and write circuit in a bit line system in the SRAM of an asynchoronous type. In the present invention, at a time of changing the order between an amplifying operation and a selecting operation, a conventional sense amplifier circuit 803 is not used simply as the per-bit sensing circuits 103, and a charging operation on a bit line pair using the bit line pair selection signal YS is performed. The present invention thereby has an effect in which the number of the transistors in the data output unit 104 can be reduced. This is because, compared with a case where an ordinary selector was used, the charging operation on the bit line pair using the bit line pair selection signal YS has enabled the selecting operation just a mere dynamic NAND gate in the data output unit 104. With this arrangement, the number of 3×n transistors is reduced in the data output circuit 103 in FIG. 9B. Further, by using the per-bit sensing circuit 103, the three control signals of the PC signal and the signals /WE and RSE are reduced.

The conventional sense amplifier in FIG. 8 and a proposed sense amplifier in FIG. 1 will be shown below. In order to speed up the read operation (or reduction of the bit line delay), the read operation is changed as follows. Referring to FIG. 8, after the selecting operation has been performed in the block 802, the amplifying operation is performed in the block 803. In this case, the time required for the selecting operation is included in the bit line delay. The bit line delay will be thereby increased, which will become a problem. In a proposed method, the order between these two operations is exchanged, thereby solving the problem. Referring to FIG. 1, after the amplifying operation has been performed at the block 103, the selecting operation is performed at the block 104. With this arrangement, a delay caused by the selecting operation can be excluded from the bit line delay. Referring to FIG. 1, though a time required for a selecting operation in the block 104 is additionally included in the bit line delay, the time of the bit line delay is smaller than a delay time caused by the selecting operation with a conventional method.

Figure 9A:
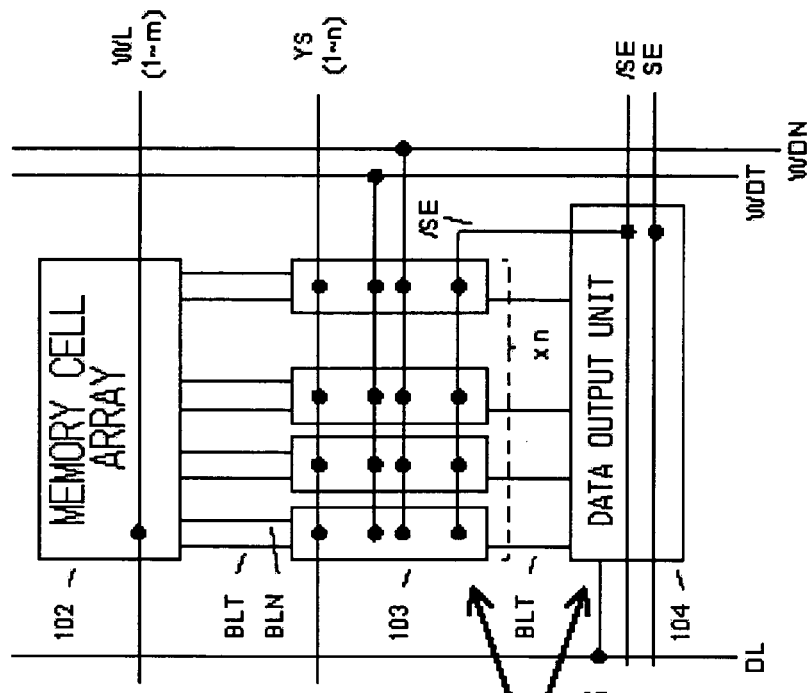
Figure 9B:
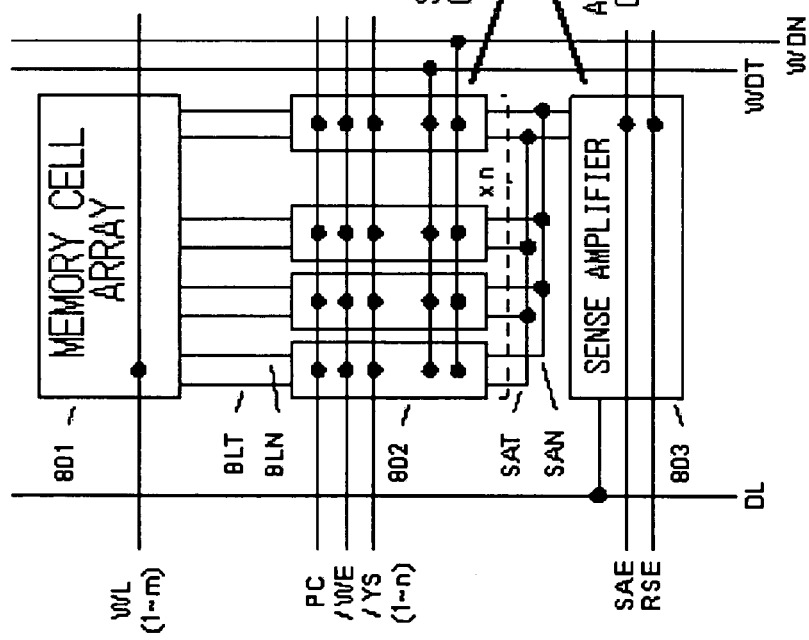
FIG. 9B shows a configuration of the present invention.

Next, the principle of the present invention will be described, using the conventional sense amplifier shown in FIG. 8 as a comparative example for contrast. FIG. 9A shows a configuration of a semiconductor storage device using the conventional sense amplifier shown in FIG. 8. FIG. 9B shows a configuration of the present invention shown in FIG. 1. As clear from FIGS. 9A and 9B, in the present invention (in FIG. 9B), in order to speed up the read operation (or reduction of the bit line delay), the order between the bit line selecting operation and the amplifying operation for the read operation is changed, compared with the configuration shown in FIG. 9A. That is, in the case of the configuration shown in FIG. 9A, after the selecting operation has been performed at the bit line pair selection circuit 802, the sense amplifier 803 performs the amplifying operation on data on a bit line. In the case of such a configuration, a time required for the bit line selecting operation at the bit line pair selection circuit 802 will be included in the bit line delay. The bit line delay will be thereby increased, which will become the problem.

On contrast therewith, the present invention is configured to include the data output unit 104 for receiving the bit lines from the per-bit sensing circuits 103 and outputting data read onto a selected bit line to a data output line, as shown in FIG. 9B. The order between the two operations (of the selecting operation and the amplifying operation) shown in FIG. 9A is exchanged. As shown in FIG. 9B, according to the present invention, after the amplifying operation has been performed at the per-bit sensing circuit 103, the selecting operation is performed at the data output unit 104. With this arrangement, the delay time caused by the bit line selecting operation can be excluded from the bit line delay. Incidentally, in the case of the configuration of the present invention in FIG. 9B, the time for the selecting operation is added at the data output unit 104. This time, however, is shorter than the delay time caused by the bit line selecting operation in the conventional method shown in FIG. 9A.

Figure 10:
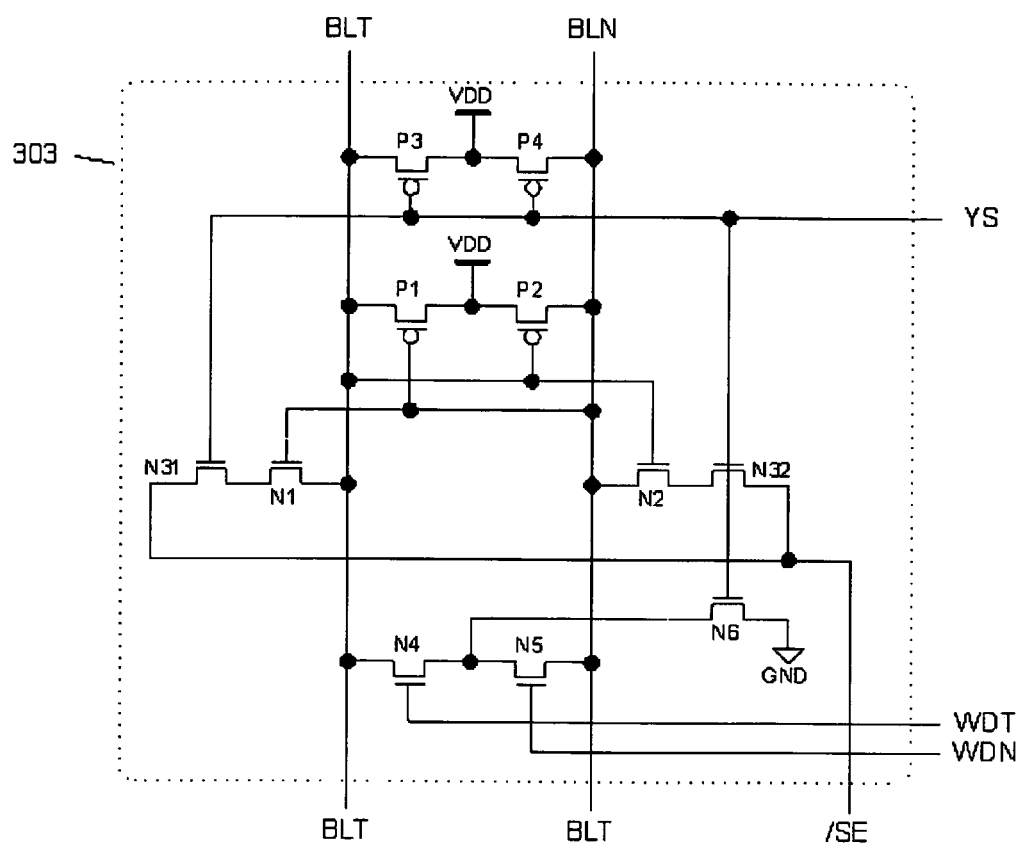
FIG. 10 is a diagram showing a configuration of a per-bit sensing circuit in a sensing circuit according to a third embodiment of the present invention.

FIG. 10 is a diagram showing a configuration of a third embodiment of the present invention. It is the diagram showing a variation example of the per-bit sensing circuit 103 in FIG. 1. Referring to FIG. 10, this per-bit sensing circuit 303 is configured by separating the nMOS transistor N3 (which has a gate connected to the signal YS and is off/on controlled) in the per-bit sensing circuit 103 shown in FIG. 2 into two transistors of nMOS transistors N31 and N32 (which have gates connected in common to the signal YS and is off/on controlled). That is, the per-bit sensing circuit 303 is configured to include an nMOS transistor N1 and the nMOS transistor N31 connected in series with each other between the bit line BLT and the signal /SE and an nMOS transistor N2 and the nMOS transistor N32 connected in series with each other between the bit line BLN and the signal /SE. Locations of nMOS transistors N1 and N31 connected in series may be exchanged. The same holds true for the nMOS transistors N2 and N32. Configurations other than these are the same as those in the example shown in FIG. 2. Thus, a description about the operation of the circuit will be omitted.

Figure 11:
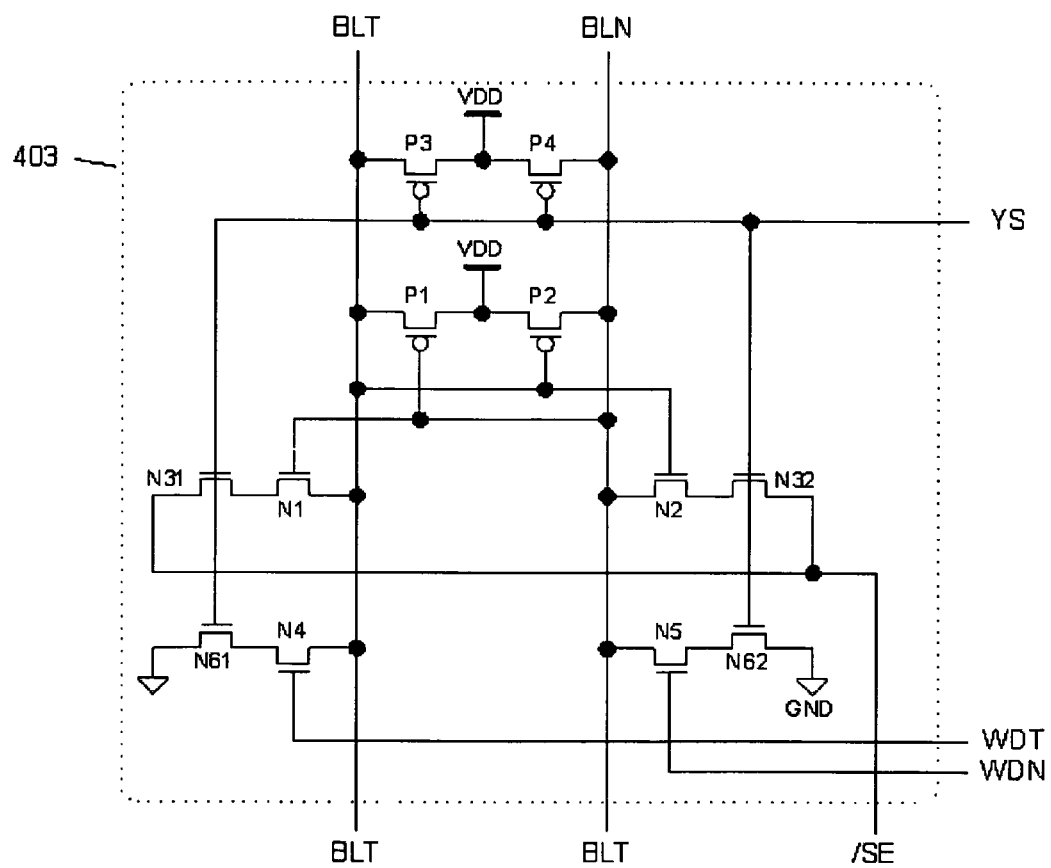
FIG. 11 is a diagram showing a configuration of a per-bit sensing circuit in a sensing circuit according to a fourth embodiment of the present invention.

FIG. 11 is a diagram showing a configuration of a fourth embodiment of the present invention, and is the diagram showing a variation example of the per-bit sensing circuit 103 in FIG. 1. Referring to FIG. 11, this per-bit sensing circuit 403 is configured by separating an nMOS transistor N3 (which has a gate connected to the signal YS and is on/off controlled) of the per-bit sensing circuit 203 shown in FIG. 7 into two transistors of nMOS transistors N31 and N32 (which have gates connected in common to the signal YS and on/off controlled). The per-bit sensing circuit 403 includes an nMOS transistor N1 and the nMOS transistor N31 connected in series with each other between the bit line BLT and the signal /SE and an nMOS transistor N2 and the nMOS transistor N32 connected in series with each other between the bit line BLN and the signal /SE. Locations of nMOS transistors N1 and N31 connected in series may be exchanged. The same holds true for the nMOS transistors N2 and N32. Configurations other than these are the same as those in the example shown in FIG. 7.

Figure 12:
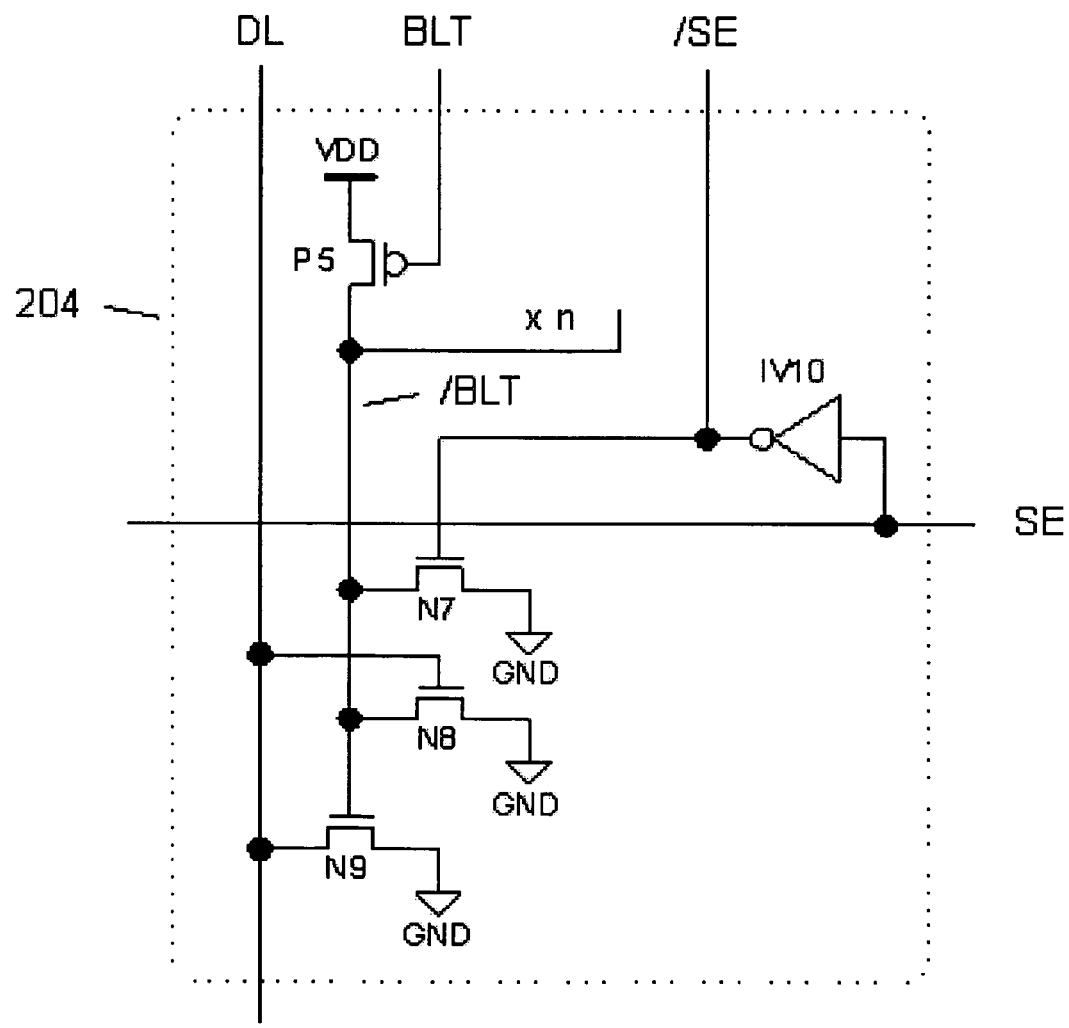
FIG. 12 is a diagram showing a configuration example of a data output unit in a sensing circuit according to a fifth embodiment of the present invention.

FIG. 12 is a diagram showing a configuration of a fifth embodiment of the present invention, and is the diagram showing a variation example of the data output circuit 104 shown in FIG. 3. Referring to FIG. 12, in this data output circuit 204, a pMOS transistor is added to the nMOS transistor N10 in the data output circuit 104 shown in FIG.

3, thereby configuring a CMOD inverter IV10 (including the pMOS transistor which has a source connected to the power supply VDD and has a gate connected to the control signal SE, and the nMOS transistor N10 which has a drain connected to a drain of the pMOS transistor, has a gate connected to the signal SE, and has a source connected to the GND with the signal /SE being output from a connecting point between the drains of the pMOS transistor and the NMOS transistor). The control signal wiring /SE in FIG. 3 (supplied to the data output unit 104 from the outside) is thereby omitted.

Figure 13:
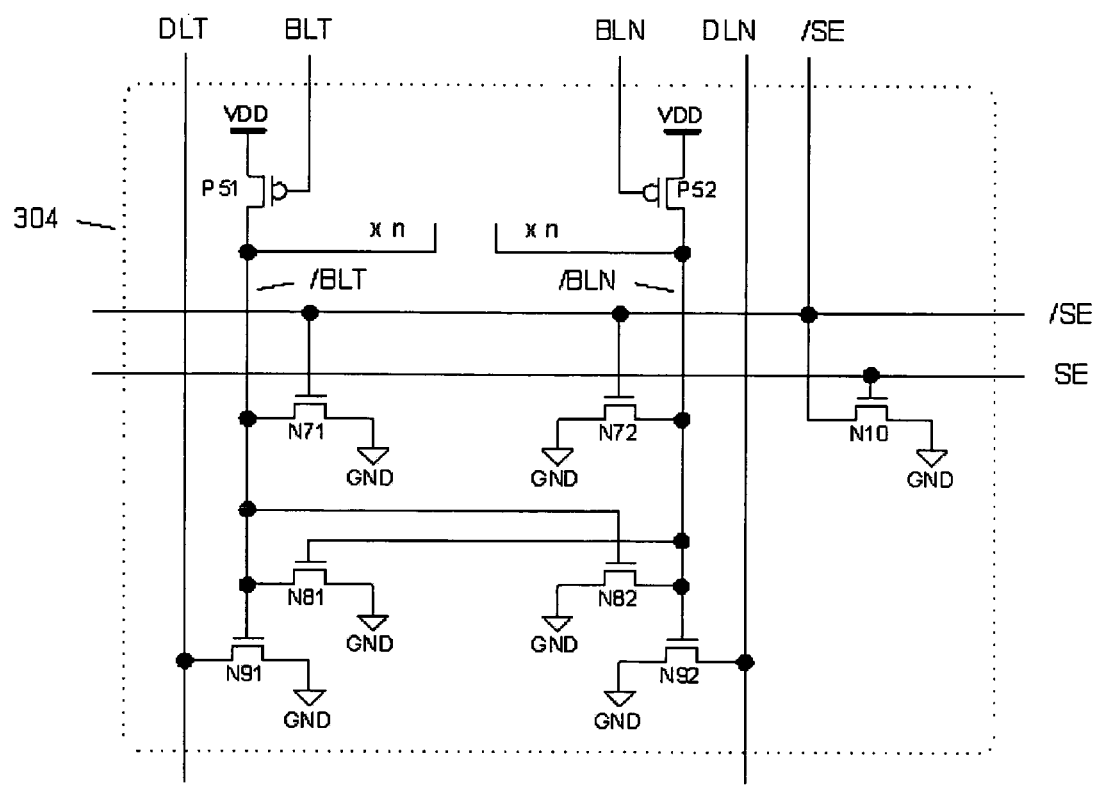
FIG. 13 is a diagram showing a configuration example of a data output unit in a sensing circuit according to a sixth embodiment of the present invention.

FIG. 13 is a diagram showing a configuration of a sixth embodiment of the present invention, and is the diagram showing a still another variation example of the data output unit 104 shown in FIG. 3. The data output unit 104 shown in FIG. 3 is configured to output the data signal to the data output line DL in single ended. Referring to FIG. 13, this data output unit 304 is configured to differentially output the data signal. That is, the data output line DL in FIG. 3 is constituted from a pair of complementary signal lines, and data output lines DLT and DLN. The pMOS transistor P5 (which has a gate connected to the bit line BLT, has a source connected to the power supply VDD, and has a drain connected to the node /BLT) in FIG. 3 is separated into pMOS transistors P51 and P52 in FIG. 13, and arranged. The pMOS transistor P51 has a gate connected to the bit line BLT, has a source connected to the power supply VDD, and has a drain connected to the node /BLT. The pMOS transistor P52 has a gate connected to the bit line BLN, has a source connected to the power supply VDD, and has a drain connected to a node /BLN. The nMOS transistor N7 (transistor for resetting) in FIG. 3, connected between the node /BLT and a ground, is separated into nMOS transistors N71 and N72 in the example shown in FIG. 13. The nMOS transistor N71 is connected between the node /BLT and the GND, while the nMOS transistor N72 is connected between the node /BLN and the GND. Gates of the nMOS transistors N71 and N72 are both connected to the signal /SE. The nMOS transistor N8 in FIG. 3, connected between the node /BLT and the GND, is separated into nMOS transistors N81 and N82 in the example shown in FIG. 13. The nMOS transistor N81, connected between the node /BLT and the GND, has a gate connected to the node /BLN. The nMOS transistor N82, connected between the node /BLN and the GND, has a gate connected to the node /BLT. The nMOS transistor N9 in FIG. 3, connected between the data output line DL and the ground GND is separated into nMOS transistors N91 and N92 in the example shown in FIG. 13. The nMOS transistor N91, connected between the data output line DLT and the GND, has a gate connected to the node /BLT. The nMOS transistor N92, connected between the data output line DLN and the GND, has a gate thereof is connected to the node /BLT.

Figure 14:
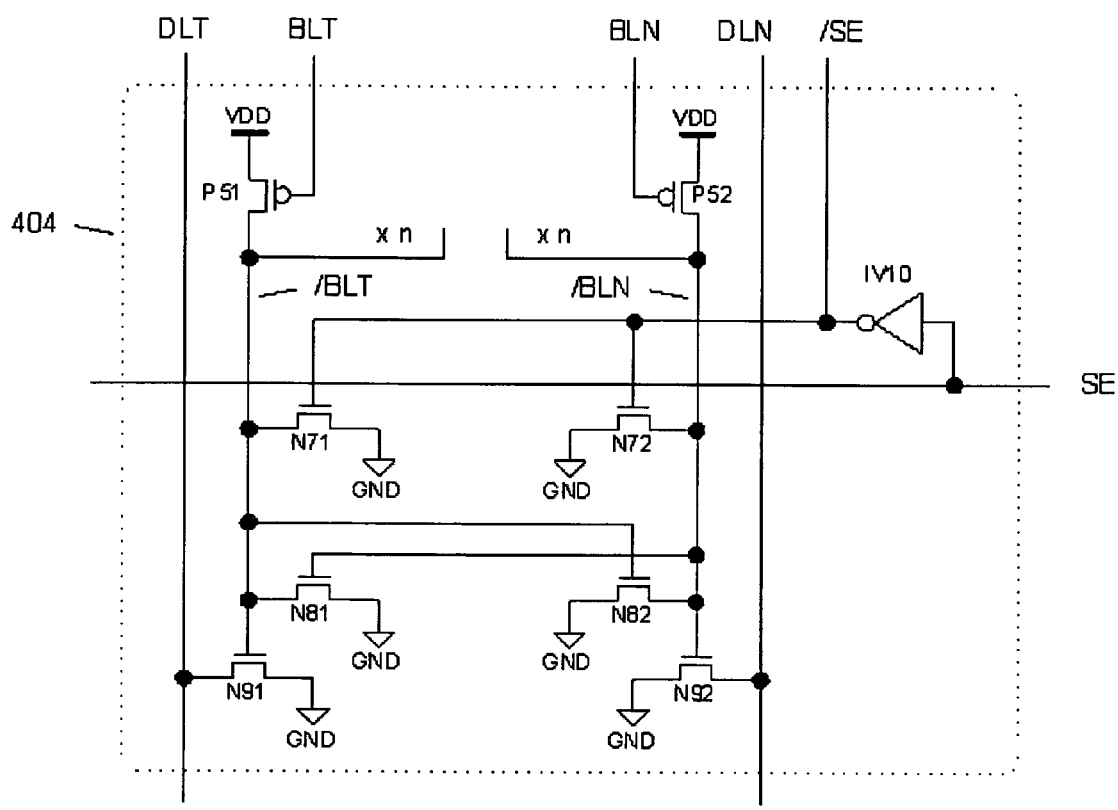
FIG. 14 is a diagram showing a configuration example of a data output unit in a sensing circuit according to a seventh embodiment of the present invention.

FIG. 14 is a diagram showing a configuration of a seventh embodiment of the present invention, and is the diagram showing a still another variation example of the data output unit 104 shown in FIG. 13. This data output unit 404 is obtained by applying the configuration in FIG. 12 to the data output unit 104 in FIG. 13. Referring to FIG. 14, in this data output unit 404, a PMOS transistor is added to the nMOS transistor N10 in the data output unit 304 in FIG. 13, thereby configuring a CMOS inverter IV10. The control signal /SE is thereby omitted.

The foregoing description was given in connection with the embodiments described above. The present invention, however, is not limited to only the configurations of the embodiments described above, and of course includes various variations and modifications that could be made by those skilled in the art within the scope of inventions of claims.

The invention claimed is:

1. A semiconductor storage device comprising:
  a memory cell array including a plurality of memory cells respectively disposed at intersections between a plurality of bit line pairs and a plurality of word lines disposed in a direction orthogonal to said bit line pairs; and
  a plurality of per-bit sensing circuits connected to said plurality of bit line pairs respectively;
  each of said per-bit sensing circuits including:
  a first circuit connected to a corresponding one of said bit line pairs, for setting voltages at the corresponding one of said bit line pairs to a first level when a bit line pair selection signal received is in an inactive state;
  a second circuit connected to the corresponding one of said bit line pairs, for setting the corresponding one of said bit line pairs to mutually complementary levels according to a signal read onto the corresponding one of said bit line pairs from a selected memory cell when the bit line pair selection signal is in an active state and a sensing circuit activation signal received is also in an active state; and
  a third circuit connected to the corresponding one of said bit line pairs, for receiving a write data signal, and setting one bit line of the corresponding one of said bit line pairs, which are set in common to the first level, to a second level complementary with said first level, based on the write data signal, when the bit line pair selection signal is in an active state, thereby setting complementary write data on the corresponding one of said bit line pair;
  said semiconductor storage device further comprising
  a data output circuit for receiving respective one bit lines of said bit line pairs from said per-bit sensing circuits, and outputting data read onto a selected bit line pair.

2. The semiconductor storage device according to claim 1, wherein said data output circuit comprises:
  a fourth circuit for outputting a first logic value when all of the bit lines received are at the first level and outputting a second logic value when at least one of said bit lines received is at the second level; and
  a fifth circuit for receiving an output signal of said fourth circuit and outputting read data to a data output line based on a value of the output signal.

3. The semiconductor storage circuit according to claim 1, wherein in said each of said per-bit sensing circuits, the second circuit comprises:
  a first latch circuit connected between the corresponding one of said bit line pairs, for setting the one bit line of the corresponding one of said bit line pairs to the first level from a power supply corresponding to the first level, responsive to the signal read onto the corresponding one of said bit line pairs from the selected memory cell; and
  a second latch circuit for connecting the other bit line of the corresponding one of said bit line pairs to a power supply potential corresponding to the second level, thereby setting the other bit line of the corresponding one of said bit line pairs to the second level;
  said second latch circuit being connected to the power supply potential corresponding to the second level through a switch which is subject to on/off control by the bit line pair selection signal.

4. The semiconductor storage device according to claim 3, wherein in the second latch circuit, the power supply potential corresponding to the second level is supplied from a line of an inverted signal of the sensing circuit activation signal.

5. The semiconductor storage device according to claim 1, wherein said memory cell array, said per-bit sensing circuits, and said data output circuit constitute a basic block;
- a plurality of first signal line groups are spaced apart to one another, said first signal line groups including said word lines extended in parallel in one direction, the bit line pair selection signals extended in parallel in the one direction, and the sensing circuit activation signal and the inverted signal of the sensing circuit activation signal;
- a plurality of second signal line groups are spaced apart to one another, including the data output line extended in a direction orthogonal to the one direction and the complementary lines for the write data signals; and
- said semiconductor storage device comprises a basic bock array including the basic blocks provided at intersections between the first and second signal line groups in an array form.

6. A semiconductor storage circuit comprising:
- a memory cell array including a plurality of memory cells respectively disposed at intersections between a plurality of bit line pairs and a plurality of word lines disposed in a direction orthogonal to said bit line pairs;
- a plurality of per-bit sensing circuits connected to said plurality of bit line pairs, respectively ; and
- a data output circuit for receiving respective one bit lines of said bit line pairs from said per-bit sensing circuits, and outputting data read to a selected one of said bit line pairs;
- each of said per-bit sensing circuits comprising:
- a pre-charge circuit connected to a corresponding one of said bit line pairs, for setting the corresponding one of said bit line pairs to a potential of a first power supply;
- a first latch circuit connected to the corresponding one of said bit line pairs, for setting the other one bit line of the corresponding one of said bit line pairs to the first supply potential, when one bit line of the corresponding one of said bit line pairs is set to a second power supply potential;
- a second latch circuit connected to the corresponding one of said bit line pairs, for assisting setting of the one bit line of the corresponding one of said bit line pairs to the second power supply potential when the one bit line of the corresponding one of said bit line pairs is set to the second power supply potential; and
- a data write circuit connected to the corresponding one of said bit line pairs, for receiving a write data signal and setting the one bit line of the corresponding one of said bit line pairs to the second power supply potential according to value of the write data signal; wherein
- control of activation/deactivation of the pre-charge circuit, the data write circuit, and the second latch circuit is performed according to a bit line pair selection signal received.

7. The semiconductor storage device according to claim 6, wherein the pre-charge circuit comprises first and second MOS transistors of a first conductivity type, with sources thereof connected in common to said first power supply, drains thereof connected to the corresponding one of said bit line pairs, respectively, and gates thereof connected to the bit line pair selection signal.

8. The semiconductor storage device according to claim 6, wherein the first latch circuit comprises third and fourth MOS transistors of a first conductivity type, with sources thereof connected in common to said first power supply, drains thereof connected to first and second bit lines constituting the corresponding one of said bit line pairs, respectively, and gates thereof cross-connected to the second and first bit lines, respectively.

9. The semiconductor storage device according to claim 6, wherein the second latch circuit comprises:
- first and second MOS transistors of a second conductivity type with drains thereof connected to first and second bit lines constituting the corresponding one of said bit line pairs, respectively, gates thereof cross-connected to the second and first bit lines, respectively, and sources thereof connected in common; and
- a third MOS transistor of a second conductivity type connected between a common connecting node of the sources of the first and second MOS transistors and an inverted signal of a sensing circuit activation signal, with a gate thereof connected to the bit line pair selection signal, for being subject to on/off control.

10. The semiconductor storage device according to claim 6, wherein the data write circuit comprises:
- fourth and fifth MOS transistors of a second conductivity type with drains thereof connected to first and second bit lines constituting the corresponding one of said bit line pairs, respectively, and gates thereof connected to a pair of complementary write data signal lines, respectively, and sources thereof connected in common; and
- a sixth MOS transistor of said second conductivity type connected between a common connecting node of the sources of the fourth and fifth MOS transistors and a second power supply potential, with a gate thereof connected to the bit line pair selection signal, for being subject to on/off control.

11. The semiconductor storage device according to claim 9, wherein the second latch circuit comprises:
- a first MOS transistor of said second conductivity type connected between a first bit line constituting the corresponding one of said bit line pairs and an inverted signal of a sensing circuit activation signal in series, with a gate thereof connected to a second bit line of the corresponding one of said bit line pairs;
- a third MOS transistor of said second conductivity type with a gate thereof connected to the bit line pair selection signal, for being subject to on/off control;
- a second MOS transistor of said second conductivity type connected in series between the second bit line and the inverted signal of the sensing circuit activation signal, with a gate thereof connected to the first bit line; and
- an eighth MOS transistor of said second conductivity type with a gate thereof connected to the bit line pair selection signal, for being subject to on/off control.

12. The semiconductor storage device according to claim 6, wherein the data write circuit comprises:
- fourth and fifth MOS transistors of a second conductivity type connected in series between a first bit line constituting the corresponding one of said bit line pairs and the second power supply potential; and
- sixth and seventh MOS transistors of said second conductivity type connected in series between a second bit line constituting the corresponding one of said bit line pairs and the second power supply potential;
- gates of the fourth and sixth MOS transistors being connected to a pair of complementary write data signal lines, respectively;
- the bit line pair selection signal being connected in common to gates of the fifth and seventh MOS transistors.

13. The semiconductor storage device according to claim 6, wherein said data output circuit comprises:
  a logic circuit for receiving respective one bit lines of said bit line pairs from said per-bit sensing circuits, for outputting a first logic value when all of the bit lines received are at the first supply potential and outputting a second logic value when at least one of the bit lines received is at the second power supply potential; and
  an output transistor for receiving an output signal of said logic circuit and driving a data output line based on the output signal.

14. The semiconductor storage circuit according to claim 13, wherein said data output circuit comprises an auxiliary circuit for receiving the sensing circuit activation signal, and setting the inverted signal of the sensing circuit activation signal to the second power supply potential when the sensing circuit activation signal is at the first supply potential.

15. The semiconductor storage device according to claim 13, wherein said logic circuit of said data output circuit comprises a plurality of fifth MOS transistors of said first conductivity type with gates thereof connected to the plurality of bit lines, respectively, sources thereof connected in common to said first power supply, and drains thereof connected to one node;
  said data output circuit further comprising seventh and eighth MOS transistors of said second conductivity type connected in parallel with each other between said one node and said second power supply, with gate thereof connected to the inverted signal of the sensing circuit activation signal and to said data output line, respectively;
  said one node being connected to a gate of said output transistor with a source thereof grounded and a drain thereof connected to said data output line.

16. The semiconductor storage device according to claim 6, wherein the second latch circuit comprises:
  a first MOS transistor of a second conductivity type connected between a first bit line constituting the corresponding one of said bit line pairs and an inverted signal of a sensing circuit activation signal in series, with a gate thereof connected to a second bit line of the corresponding one of said bit line pairs;
  a third MOS transistor of said second conductivity type with a gate thereof connected to the bit line pair selection signal, for being subject to on/off control;
  a second MOS transistor of said second conductivity type connected between the second bit line and the inverted signal of the sensing circuit activation signal, with a gate thereof connected to the first bit line; and
  a fourth MOS transistor of said second conductivity type with a gate thereof connected to the bit line pair selection signal, for being subject to on/off control.

17. A semiconductor storage device comprising:
  a memory cell array including a plurality of memory cells respectively disposed at intersections between a plurality of bit line pairs and a plurality of word lines disposed in a direction orthogonal to said bit line pairs;
  a plurality of per-bit sensing circuits connected to said plurality of bit line pairs, respectively; and
  a data output circuit for receiving respective one bit lines of said bit line pairs from said per-bit sensing circuits, and outputting data read to a selected one of said bit line pairs;
  each of said per-bit sensing circuits comprising:
  a pre-charge circuit comprising first and second MOS transistors of a first conductivity type with sources thereof connected in common to a first power supply, drains thereof connected to a corresponding one of said bit line pairs, and gates thereof connected to a bit line pair selection signal;
  a first latch circuit comprising third and fourth MOS transistors of said first conductivity type with sources thereof connected in common to said first power supply, drains thereof connected to first and second bit lines constituting the corresponding one of said bit line pairs, respectively, and gates thereof cross-connected to the second and first bit lines, respectively;
  a second latch circuit comprising:
  first and second MOS transistors of a second conductivity type with drains thereof connected to the first and second bit lines constituting the corresponding one of said bit line pairs, respectively, gates thereof cross-connected to the second and first bit lines, respectively, and sources thereof connected in common; and
  a third MOS transistor of said second conductivity type connected between a common connecting node of the sources of the first and second MOS transistors and an inverted signal of a sensing circuit activation signal, with a gate thereof connected to the bit line pair selection signal, for being subject to on/off control;
  fourth and fifth MOS transistors of said second conductivity type with drains thereof connected to the first and second bit lines constituting the corresponding one of said bit line pairs, respectively, gates thereof connected to a pair of complementary write data signal lines, respectively, and sources thereof connected in common; and
  a data write circuit including a sixth MOS transistor of said second conductivity type connected between a potential of a second power supply and a common connecting node of the sources of the first and fifth MOS transistors, with a gate thereof connected to the bit line pair selection signal, for being subject to on/off control;
  said data output circuit comprising:
  a logic circuit for outputting a first logic value when all of the bit lines from said per-bit sensing circuits are at the first supply potential and outputting a second logic value when at least one of the bit lines is at the second power supply potential; and
  an output transistor for receiving an output signal of said logic circuit and driving a data output line based on the output signal.

18. A semiconductor storage device comprising:
  a memory cell array including a plurality of memory cells disposed at intersections between a plurality of bit line pairs and a plurality of word lines disposed in a direction orthogonal to said bit line pairs;
  a plurality of per-bit sensing circuits connected to said plurality of bit line pairs, respectively; and
  a data output circuit for receiving said respective bit line pairs of said per-bit sensing circuits and differentially outputting data read to a selected one of said bit line pairs;
  each of said per-bit sensing circuits comprising:
  a pre-charge circuit comprising first and second MOS transistors of a first conductivity type with sources thereof connected in common to a first power supply, drains thereof connected to a corresponding one of said bit line pairs, and gates thereof connected to the bit line pair selection signal;
  a first latch circuit comprising third and fourth MOS transistors of said first conductivity type with sources thereof connected in common to said first power supply, drains thereof connected to first and second bit lines constituting the corresponding one of said bit line pairs, respectively, and gates thereof cross-connected to the second and first bit lines, respectively;

a second latch circuit comprising:

a first MOS transistor of a second conductivity type with a drain thereof connected to the first bit line, a gate thereof connected to the second bit line, and a source thereof connected to an inverted signal of a sensing circuit activation signal through a third MOS transistor of said second conductivity type with a gate thereof connected to the bit line pair selection signal, for being subject to on/off control; and a second MOS transistor of said second conductivity type with a drain thereof connected to the second bit line, a gate thereof connected to the first bit line, and a source thereof connected to the inverted signal of the sensing circuit activation signal through the third MOS transistor of said second conductivity type; and a data write circuit including:

a fourth MOS transistor of said second conductivity type with a drain thereof connected to the first bit line, a gate thereof connected to one write data signal line of a pair of complementary data signal lines, and a source thereof connected to a second power supply potential through a sixth MOS transistor of said second conductivity type with a gate thereof connected to the bit line pair selection signal, for being subject to on/off control; and a fifth MOS transistor of said second conductivity type with a drain thereof connected to the second bit line, a gate thereof connected to the other write data signal line of the pair of complementary write data signal lines, and a source thereof connected to the second power supply potential through the sixth MOS transistor of said second conductivity type;

said data output circuit comprising:

a first logic circuit for receiving respective one bit lines of said bit line pairs from said plurality of per-bit sensing circuits, and outputting a first logic value when all of the bit lines received are at a potential of said first power supply and outputting a second logic value when at least one of the bit lines received is at the second power supply potential;

a first output transistor for receiving an output signal of said first logic circuit and driving a first data output line based on the output signal;

a second logic circuit for receiving the respective other bit lines of said bit line pairs from said plurality of per-bit sensing circuits, and outputting the first logic value when all of the bit lines received are at the first supply potential and outputting the second logic value when at least one of the bit lines received is at the second power supply potential; and a second output transistor for receiving an output signal of said second logic circuit and driving a second data signal line complementary with said first data output line, based on the output signal.

19. The semiconductor storage device according to claim 18, wherein said data output circuit includes an auxiliary circuit for receiving the sensing circuit activation signal, and setting the inverted signal of the sensing circuit activation signal to the second power supply potential, when the sensing circuit activation signal is at the first supply potential.

20. The semiconductor storage device according to claim 18, wherein said data output circuit comprises:

a circuit for receiving the output signal of said first logic circuit, for setting the output of said second logic circuit to the second logic value when the output signal of said first logic circuit has the first logic value; and a circuit for receiving the output signal of said second logic circuit, for setting the output signal of said first logic circuit to the second logic value when the output signal of said second logic circuit has the first logic value.

21. The semiconductor storage device according to claim 18, wherein said first logic circuit of said data output circuit includes:

a plurality of fifth MOS transistors of said first conductivity type with gates thereof respectively connected to each of one bit lines of said bit line pairs, sources thereof connected in common to said first power supply, and drains thereof connected in common to a first node;

said data output circuit further including seventh and eighth MOS transistor of said second conductivity type connected between said first node and said second power supply in parallel with each other, with a gate of said seventh MOS transistor of said second conductivity type connected to the inverted signal of the sensing circuit activation signal;

said first node being connected to a gate of said first output transistor with a drain thereof connected to said first data output line; and wherein said second logic circuit of said data output circuit includes ninth MOS transistors of said first conductivity type with gates thereof respectively connected to each of the other bit lines of said bit line pairs; sources thereof connected in common to said first power supply, and drains thereof connected in common to a second node;

said data output circuit further including tenth and eleventh MOS transistors of said second conductivity type connected between said second node and said second power supply in parallel with each other, with a gate of said tenth MOS transistor of said second conductivity type connected to the inverted signal of the sensing circuit activation signal;

said second node being connected to a gate of said second output transistor with a source thereof grounded, a drain thereof connected to a second data output line complementary with said first data output line;

a gate of said eighth MOS transistor of said second conductivity type being connected to said second node; and a gate of said eleventh MOS transistor of said second conductivity type being connected to said first node.

22. The semiconductor storage device according to claim 18, wherein in the second latch circuit, the source of the first MOS transistor of said second conductivity type is connected to the inverted signal of the sensing circuit activation signal through the third MOS transistor of said second conductivity type; and the source of the second MOS transistor of said second conductivity type is connected to the inverted signal of the sensing circuit activation signal, through an MOS transistor of said second conductivity type provided aside from the third MOS transistor of said second conductivity type, with a gate thereof connected to the bit line pair selection signal, for being subject to on/off control.

23. The semiconductor storage device according to claim 18, in the data write circuit, the source of the fourth MOS transistor of said second conductivity type is connected to the second power supply potential through the sixth MOS transistor of said second conductivity type; and the source of the fifth MOS transistor of said second conductivity type is connected to the second power supply potential, through an MOS transistor of said second conductivity type provided aside from the sixth MOS transistor of said second conductivity type, with a gate thereof connected to the bit line pair selection signal, for being subject to on/off control.

* * * * *